United States Patent
Kim et al.

(10) Patent No.: US 12,484,373 B2
(45) Date of Patent: Nov. 25, 2025

(54) ORGANIC LIGHT-EMITTING DEVICE AND ELECTRONIC APPARATUS INCLUDING THE SAME

(71) Applicants: Samsung Electronics Co., Ltd., Suwon-si (KR); Seoul National University R&DB Foundation, Seoul (KR)

(72) Inventors: Jong Soo Kim, Hanam-si (KR); Jang-joo Kim, Seoul (KR); Bomi Sim, Seoul (KR); Hosuk Kang, Suwon-si (KR); Eunsuk Kwon, Suwon-si (KR); Sunghan Kim, Seongnam-si (KR); Joonghyuk Kim, Seoul (KR); Sungho Nam, Daegu (KR); Hyejin Bae, Suwon-si (KR); Sooghang Ihn, Hwaseong-si (KR)

(73) Assignees: SAMSUNG ELECTRONICS CO., LTD., Gyeonggi-Do (KR); SEOUL NATIONAL UNIVERSITY R&DB FOUNDATION, Seoul (KR)

(*) Notice: Subject to any disclaimer, the term of this patent is extended or adjusted under 35 U.S.C. 154(b) by 285 days.

(21) Appl. No.: 18/302,105

(22) Filed: Apr. 18, 2023

(65) Prior Publication Data
US 2023/0276646 A1    Aug. 31, 2023

Related U.S. Application Data

(63) Continuation of application No. 16/944,416, filed on Jul. 31, 2020, now abandoned.

(30) Foreign Application Priority Data

Jul. 31, 2019 (KR) .......................... 10-2019-0093429
Jul. 30, 2020 (KR) .......................... 10-2020-0095523

(51) Int. Cl.
*H10K 50/155* (2023.01)
*H10K 50/11* (2023.01)
(Continued)

(52) U.S. Cl.
CPC ......... *H10K 50/155* (2023.02); *H10K 85/342* (2023.02); *H10K 85/636* (2023.02);
(Continued)

(58) Field of Classification Search
CPC ............. H01L 51/0072; H01L 51/0061; H01L 51/0085; H01L 51/506; H01L 2251/55;
(Continued)

(56) References Cited

U.S. PATENT DOCUMENTS 9,349,954 B2    5/2016  D'Andrade et al.
2009/0121624 A1*  5/2009  D'Andrade .......... H10K 85/342
                                             313/504

(Continued)

FOREIGN PATENT DOCUMENTS

CN    108269948 A    7/2018
KR    20100106369 A   10/2010
(Continued)

OTHER PUBLICATIONS

Bomi Sim, et al., Comprehensive Model of the Degradation of Organic Light-Emitting Diodes andApplication for Efficient, Stable Blue Phosphorescent Devices with ReducedInfluence of Polarons, Physical Review Applied 14, 024002 (2020), 15 pp.
(Continued)

*Primary Examiner* — Aaron J Gray
(74) *Attorney, Agent, or Firm* — CANTOR COLBURN LLP

(57) ABSTRACT

Provided are an organic light-emitting device satisfying a certain range of [Q(t=T50)]Polaron and an electronic apparatus including the organic light-emitting device.

16 Claims, 5 Drawing Sheets

(51) Int. Cl.
  *H10K 50/15* (2023.01)
  *H10K 50/16* (2023.01)
  *H10K 50/17* (2023.01)
  *H10K 50/18* (2023.01)
  *H10K 85/30* (2023.01)
  *H10K 85/60* (2023.01)
  *H10K 101/00* (2023.01)
  *H10K 101/10* (2023.01)

(52) U.S. Cl.
  CPC ......... *H10K 85/6572* (2023.02); *H10K 50/11* (2023.02); *H10K 50/15* (2023.02); *H10K 50/16* (2023.02); *H10K 50/17* (2023.02); *H10K 50/171* (2023.02); *H10K 50/181* (2023.02); *H10K 85/30* (2023.02); *H10K 85/626* (2023.02); *H10K 85/633* (2023.02); *H10K 85/6574* (2023.02); *H10K 2101/00* (2023.02); *H10K 2101/10* (2023.02)

(58) Field of Classification Search
  CPC ............ H10K 85/636; H10K 85/6572; H10K 50/155; H10K 85/342; H10K 2101/00
  See application file for complete search history.

(56) References Cited

U.S. PATENT DOCUMENTS

| | | | | |
|---|---|---|---|---|
| 2011/0127503 | A1* | 6/2011 | Takahashi | C09B 57/00 252/301.16 |
| 2018/0233678 | A1 | 8/2018 | Ihn et al. | |
| 2019/0074468 | A1 | 3/2019 | Kwak et al. | |
| 2019/0319210 | A1* | 10/2019 | Nakamura | C07F 15/00 |

FOREIGN PATENT DOCUMENTS

| | | |
|---|---|---|
| KR | 20180084644 A | 7/2018 |
| KR | 20190026618 A | 3/2019 |

OTHER PUBLICATIONS

English translation of Office Action dated Aug. 5, 2024, issued in corresponding KR Patent Application No. 10-2020-0095523, 7 pp.

Office Action dated Aug. 5, 2024, issued in corresponding KR Patent Application No. 10-2020-0095523, 7 pp.

Atula S. D. Sandanayaka et al., "Degradation Mechanisms of Organic Light-Emitting Diodes Based on Thermally Activated Delayed Fluorescence Molecules", J. Phys. Chem. C, 119, 23845-23851. (2015).

H. Yamamoto et al., "Improved initial drop in operational lifetime of blue phosphorescent organic light emitting device fabricated under ultra high vacuum condition", Appl. Phys. Lett. 99, 033301 (2011).

Jaesang Lee et al., "Hot excited state management for long-lived blue phosphorescent organic light-emitting diodes", Nature Communications, 8, Article No. 15566 (2017).

N. C. Giebink et al., "Direct evidence for degradation of polaron excited states in organic light emitting diodes", J. Appl. Phys. 105, 124514 (2009).

N. C. Giebink et al., "Intrinsic luminance loss in phosphorescent small-molecule organic light emitting devices due to bimolecular annihilation reactions", J. Appl. Phys. 103, 044509 (2008).

Qi Wang et al., "Exciton-Polaron-Induced Aggregation of Wide-Bandgap Materials and its Implication on the Electroluminescence Stability of Phosphorescent Organic Light-Emitting Devices", Adv. Funct. Mater., 24, 2975-2985. (2014).

Sinheui Kim et al., "Degradation of blue-phosphorescent organic light-emitting devices involves exciton-induced generation of polaron pair within emitting layers", Nature Communications, 9, Article No. 1211 (2018).

Yong Joo Cho et al., "Increased Electromer Formation and Charge Trapping in Solution-Processed versus Vacuum-Deposited Small Molecule Host Materials of Organic Light-Emitting Devices" ACS Appl. Mater. Interfaces, 9, 40564-40572. (2017).

* cited by examiner

ORGANIC LIGHT-EMITTING DEVICE AND ELECTRONIC APPARATUS INCLUDING THE SAME

CROSS-REFERENCE TO RELATED APPLICATION

This application is a continuation application of U.S. application Ser. No. 16/944,416, which claims priority to and the benefit of Korean Patent Application Nos. 10-2019-0093429, filed on Jul. 31, 2019, and 10-2020-0095523, filed on Jul. 30, 2020, each filed in the Korean Intellectual Property Office, the contents of which are incorporated herein in their entirety by reference.

BACKGROUND

1. Field

One or more embodiments relate to an organic light-emitting device and an electronic apparatus including the same.

2. Description of Related Art

Organic light-emitting devices are self-emission devices that have wide viewing angles, a high contrast ratio, and short response times, and exhibit excellent characteristics in terms of luminance, driving voltage, and response speed.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transition from an excited state to a ground state to thereby generate light.

SUMMARY

One or more embodiments include an organic light-emitting device having a long lifespan and an electronic apparatus including the organic light-emitting device.

Additional aspects will be set forth in part in the description which follows and, in part, will be apparent from the description, or may be learned by practice of the presented embodiments of the disclosure.

According to one or more embodiments, an organic light-emitting device includes a first electrode, a second electrode facing the first electrode, and an organic layer between the first electrode and the second electrode, wherein the organic layer includes an emission layer, and
$[Q(t=T_{50})]_{Polaron}$ of the organic light-emitting device is greater than 0 cm$^{-3}$ and equal to or less than about $3.30 \times 10^{17}$ cm$^{-3}$, $[Q(t=T_{50})]_{Polaron}$ is a density of a quencher produced by a polaron in the organic light-emitting device after driving the organic light-emitting device at 500 nit at a time corresponding to a luminance of 50% of an initial luminance, and $[Q(t=T_{50})]_{Polaron}$ is calculated i) by obtaining a curve of time versus driving voltage variation by measuring the driving voltage variation of the organic light-emitting device at the time (t) corresponding to the luminance of 50% of the initial luminance, ii) by fitting a rate equation of quencher production from the curve of the time versus driving voltage variation, and iii) from the 0th term for a density of excitons in the rate equation of the quencher production.

According to one or more embodiments, an organic light-emitting device includes a first electrode, a second electrode facing the first electrode, and an organic layer between the first electrode and the second electrode, wherein the organic layer includes an emission layer and a hole transport region which is between the first electrode and the emission layer, the emission layer includes a dopant and a host, the dopant and the host are different from each other, an amount of the dopant is equal to or greater than about 20 parts by weight based on 100 parts by weight of the emission layer, the hole transport region includes a hole injection layer, a hole transport layer, a first electron blocking layer, and a second electron blocking layer, which are sequentially stacked on the first electrode, and the hole injection layer, the hole transport layer, the first electron blocking layer, and the second electron blocking layer each comprise a compound and the compounds of the hole injection layer, the hole transport layer, the first electron blocking layer, and the second electron blocking layer are different from each other.

According to one or more embodiments, an electronic apparatus includes the organic light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
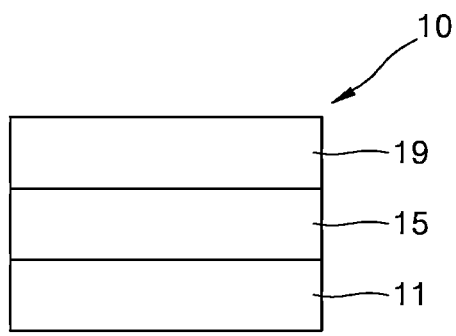
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

According to one or more embodiments, an organic light-emitting device includes a first electrode, a second electrode facing the first electrode, and an organic layer between the first electrode and the second electrode. The organic layer may include an emission layer.

$[Q(t=T_{50})]_{Polaron}$ of the organic light-emitting device may be greater than 0 cm$^{-3}$ and equal to or less than about 3.30×10$^{17}$ cm$^{-3}$.

$[Q(t=T_{50})]_{Polaron}$ is a density of a quencher produced by a polaron in the organic light-emitting device after driving the organic light-emitting device at 500 nit at a time corresponding to a luminance of 50% of an initial luminance. $Q(t=T_{50})]_{Polaron}$ may be calculated i) by obtaining a curve of time versus driving voltage variation by measuring driving voltage variation of the organic light-emitting device at the time (t) corresponding to the luminance of 50% of the initial luminance, ii) by fitting a rate equation of quencher production from the curve of the time versus driving voltage variation, and iii) from the 0th term for a density of excitons in the rate equation of the quencher production.

Degradation of the organic light-emitting device refers to a phenomenon in which luminescence efficiency decreases during driving of the organic light-emitting device while driving voltage increases to maintain the same current density. In this regard, degradation of the organic light-emitting device may cause a decrease in a lifespan of the organic light-emitting device. Production of a quencher in the emission layer may be considered as one of the causes of deterioration of the organic light-emitting device. Electrons and holes injected into the emission layer after driving the organic light-emitting device may be able to form excitons in a host and/or a dopant in the emission layer. Here, energy of the excitons formed in the host included in the emission layer may be transferred to the dopant. The excitons formed in the host and/or the excitons formed in the dopant may transit to a ground state to thereby emit light. As the driving of the organic light-emitting device proceeds, a density of a quencher in the emission layer may be increased. In this regard, the quencher may extinguish the excitons in the emission layer, or may trap charges injected into the emission layer and cause charge recombination at the quencher. Accordingly, the exciton formation efficiency in the emission layer may be decreased, thereby causing a decrease in luminescence efficiency of the organic light-emitting device and an increase in driving voltage of the organic light-emitting device.

In particular, a rate of the charge recombination at the quencher by trapping the charges is closely related to the amount of the quencher produced according to the driving time of the organic light-emitting device. That is, when driving the organic light-emitting device under a constant current density, the variation in the time versus driving voltage may be expressed as an equation for the variation in the time versus quencher density. Thus, after measuring the variation in the driving voltage of the organic light-emitting device, a rate equation of the quencher production may be derived therefrom. Here, a density of a polaron produced in the organic light-emitting device that is being driven under a constant current density is constant. However, considering a phenomenon whereby the exciton density decreases over time, the density of the quencher produced by the polaron may be calculated from the 0th term for the exciton density in the rate equation of the quencher production. When $[Q(t=T_{50})]_{Polaron}$ calculated as described above is satisfied within the ranges above, the density of the quencher in the emission layer may be effectively controlled, such that the organic light-emitting device may have a long lifespan.

In one or more embodiments, $[Q(t=T_{50})]_{Polaron}$ of the emission layer may be greater than $0\ cm^{-3}$ and equal to or less than about $1.95 \times 10^{17}\ cm^{-3}$, or may be greater than 0 $cm^{-3}$ and equal to or less than about $1.88 \times 10^{17}\ cm^{-3}$.

In one or more embodiments, $[Q(t=T_{50})]_{Environmental}$ of the organic light-emitting device may be greater than $0\ cm^{-3}$ and less than about $2.10 \times 10^{17}\ cm^{-3}$.

$[Q(t=T_{50})]_{Environmental}$ is a density of a quencher produced by an external environmental factor in the organic light-emitting device after driving the organic light-emitting device at 500 nit at a time corresponding to a luminance of 50% of an initial luminance. $Q(t=T_{50})_{Environmental}$ may be calculated i) by obtaining a curve of time versus driving voltage variation by measuring driving voltage variation of the organic light-emitting device at the time (t) corresponding to the luminance of 50% of the initial luminance, ii) fitting a rate equation of quencher production from the curve of the time versus driving voltage variation, and iii) by performing an additional fitting to a rapid increase of the driving voltage at an initial driving voltage variation.

When $[Q(t=T_{50})]_{Environmental}$ of the organic light-emitting device calculated as described above is satisfied within the ranges above, the density of the quencher in the emission layer may be effectively controlled, so that the organic light-emitting device may have a long lifespan.

In one or more embodiments, the external environmental factor may be oxygen, moisture, or any combination thereof.

In one or more embodiments, an amount of the external environmental factor in the emission layer may be greater than 0 ppm and equal to or less than 1,000 ppm.

In one or more embodiments, $[Q(t=T_{50})]_{Environmental}$ of the emission layer may be greater than $0\ cm^{-3}$ and equal to or less than about $1.30 \times 10^{17}\ cm^{-3}$.

The emission layer may include a dopant and a host.

In the emission layer, the dopant and the host may be different from each other.

In the emission layer, an amount (weight) of the host may be greater than that (weight) of the dopant.

In one or more embodiments, the amount of the dopant may be equal to or greater than 20 parts by weight based on 100 parts by weight of the emission layer.

In one or more embodiments, the amount of the dopant may be in a range of about 20 parts by weight to about 40 parts by weight based on 100 parts by weight of the emission layer.

In the emission layer, the dopant may be a phosphorescent dopant including a transition metal.

In one or more embodiments, the phosphorescent dopant may include a transition metal and at least one bidentate ligand.

In one or more embodiments, at least one bidentate ligand among the at least one bidentate ligand may include a carbene moiety bound to the transition metal via a coordinate bond.

In one or more embodiments, the phosphorescent dopant may emit blue light.

In one or more embodiments, the phosphorescent dopant may emit blue light having a CIEx coordinate from about 0.13 to about 0.17 and a CIEy coordinate from about 0.20 to about 0.30.

In one embodiment, the host included in the emission layer may include at least one cyano group and at least one carbazole group.

In one or more embodiments, the phosphorescent dopant may include an organometallic compound represented by Formula 81. In one or more embodiments, the host may include a compound represented by Formula 91:

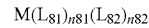

Formula 81

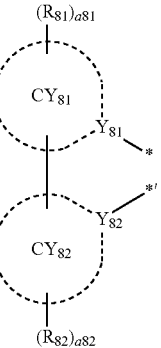

Formula 81A

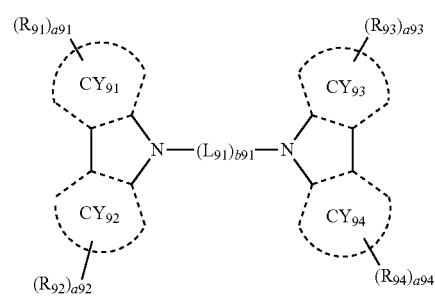

Formula 91

In Formulae 81, 81A, and 91,

M may be iridium (Ir), platinum (Pt), osmium (Os), titanium (Ti), zirconium (Zr), hafnium (Hf), europium (Eu), terbium (Tb), thulium (Tm), or rhodium (Rh), $L_{81}$ may be a ligand represented by Formula 81A, and n81 may be 1, 2, or 3.

When n81 is 2 or more two or more of $L_{81}$(s) may be identical to or different from each other, $L_{82}$ may be an organic ligand, and n82 may be 0, 1, 2, 3, or 4.

When n82 is 2 or more, two or more of $L_{82}$(s) may be identical to or different from each other, ring $Y_{81}$ and $Y_{82}$ may each independently be carbon (C) or nitrogen (N), ring $CY_{81}$, ring $CY_{82}$, and ring $CY_{91}$ to ring $CY_{94}$ may each independently be a $C_5$-$C_{30}$ carbocyclic group or a $C_1$-$C_{30}$ heterocyclic group, $L_{91}$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b91 may be an integer from 1 to 5, $R_{81}$, $R_{82}$, $R_{91}$ to $R_{94}$, and $R_{10a}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), a81, a82, and a91 to a94 may each independently be an integer from 0 to 5, when a81 is 2 or more, two or more of $R_{81}$(s) may be identical to or different from each other, when a82 is 2 or more, two or more of $R_{82}$(s) may be identical to or different from each other, when a91 is 2 or more, two or more of $R_{91}$(s) may be identical to or different from each other, when a92 is 2 or more, two or more of $R_{92}$(s) may be identical to or different from each other, when a93 is 2 or more, two or more of $R_{93}$(s) may be identical to or different from each other, when a94 is 2 or more, two or more of $R_{94}$(s) may be identical to or different from each other,

* and *' in Formula 81A each indicate a binding site to M in Formula 81, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$), or any combination thereof, and $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a C₁-C₁₀ heterocycloalkenyl group; a C₆-C₆₀ aryl group which is unsubstituted or substituted with deuterium, a C₁-C₆₀ alkyl group, a C₆-C₆₀ aryl group, or any combination thereof; a C₆-C₆₀ aryloxy group; a C₆-C₆₀ arylthio group; a C₁-C₆₀ heteroaryl group; a monovalent non-aromatic condensed polycyclic group; or a monovalent non-aromatic condensed heteropolycyclic group.

In one or more embodiments, in Formula 81, M may be Ir.

In one or more embodiments, in Formula 81, n81 may be 3, and n82 may be 0.

In one or more embodiments, in Formula 81A, $Y_{81}$ and $Y_{82}$ may each be C.

In one or more embodiments, in Formula 81A, $Y_{81}$ and $Y_{82}$ may each be C, a bond between $Y_{81}$ and M may be a coordinate bond, and a bond between $Y_{82}$ and M may be a covalent bond. That is, $Y_{81}$ may be C of a carbene moiety. Accordingly, the ligand represented by Formula 81A may include a carbene moiety bound to M in Formula 81 via a coordinate bond.

In one or more embodiments, the organometallic compound represented by Formula 81 may be electrically neutral.

In one or more embodiments, in Formulae 81A and 91, ring $CY_{81}$, ring $CY_{82}$, and ring $CY_{91}$ to ring $CY_{94}$ may each independently be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other, the first ring may be a cyclopentane group, a cyclopentadiene group, a furan group, a thiophene group, a pyrrole group, a silole group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, in Formula 81A, ring $CY_{81}$ and ring $CY_{82}$ may each independently be a cyclopentane group, a cyclohexane group, a cycloheptane group, a cyclopentene group, a cyclohexene group, a cycloheptene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, a norbornene group, a pyridoimidazole group, a pyrimidinoimidazole group, a pyrazinoimidazole group, or a pyridazinoimidazole group.

In one or more embodiments, in Formula 81A, $Y_{81}$ and $Y_{82}$ may each be C, a bond between $Y_{81}$ and M may be a coordinate bond, a bond between $Y_{82}$ and M may be a covalent bond, ring $CY_{81}$ may be an imidazole group, a benzimidazole group, a pyridoimidazole group, a pyrimidinoimidazole group, a pyrazinoimidazole group, or a pyridazinoimidazole group, and ring $CY_{82}$ may be a benzene group.

In one or more embodiments, in Formula 91, ring $CY_{91}$ to ring $CY_{94}$ may each independently be a benzene group, a carbazole group, a dibenzofuran group, a dibenzothiophene group, or a fluorene group.

In one or more embodiments, in Formula 91, $L_{91}$ may be a benzene group, a pyridine group, a pyrimidine group, or a naphthalene group, each unsubstituted or substituted with at least one $R_{10a}$.

In one or more embodiments, in Formula 91, b91 may be 1, 2, 3, or 4.

In one or more embodiments, in Formulae 81A and 91, $R_{81}$, $R_{82}$, $R_{91}$ to $R_{94}$, and $R_{10a}$ may each independently be:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF₅, a C₁-C₂₀ alkyl group C₁-C₂₀ alkoxy group, or a C₁-C₂₀ alkylthio group;
a C₁-C₂₀ alkyl group, a C₁-C₂₀ alkoxy group, or a C₁-C₂₀ alkylthio group, each substituted with deuterium, —F, —Cl, —Br, —I, —CD₃, —CD₂H, —CDH₂, —CF₃, —CF₂H, —CFH₂, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a C₁-C₁₀ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a (C₁-C₂₀ alkyl)cyclopentyl group, a (C₁-C₂₀ alkyl)cyclohexyl group, a (C₁-C₂₀ alkyl)cycloheptyl group, a (C₁-C₂₀ alkyl)cyclooctyl group, a (C₁-C₂₀ alkyl)adamantanyl group, a (C₁-C₂₀ alkyl)norbornanyl group, a (C₁-C₂₀ alkyl)norbornenyl group, a (C₁-C₂₀ alkyl)cyclopentenyl group, a (C₁-C₂₀ alkyl)cyclohexenyl group, a (C₁-C₂₀ alkyl)cycloheptenyl group, a (C₁-C₂₀ alkyl)bicyclo

[1.1.1]pentyl group, a ($C_1$-$C_{20}$ alkyl)bicyclo[2.1.1] hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzisothiazolyl group, a benzoxazolyl group, a benzisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyrdinyl group, an imidazopyrmidinyl group, an azacarbazolyl group, an azadibenzofuranyl group or azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo [1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzisothiazolyl group, a benzoxazolyl group, a benzisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and $Q_1$ to $Q_9$ may each independently be:

—$CH_3$, —$CD_3$, —$CD_2H$, —$CDH_2$, —$CH_2CH_3$, —$CH_2CD3$, —$CH_2CD2H$, —$CH_2CDH_2$, —CHDCH$_3$, —CHDCD$_2$H, —CHDCDH$_2$, —CHDCD$_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, in Formulae 81A and 91, a81, a82, and a91 to a94 may each independently be 0, 1, 2, or 3.

In one or more embodiments, a group represented by

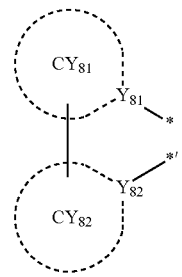

in Formula 81A may be a group represented by one of Formulae 81A-1 to 81A-9:

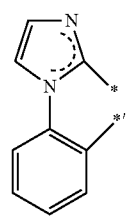

81A-1

81A-2 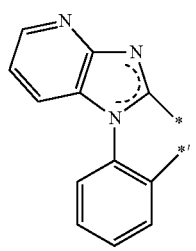

81A-3 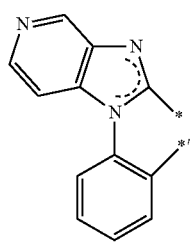

81A-4 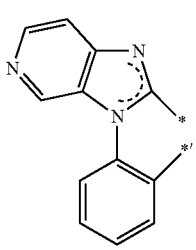

81A-5 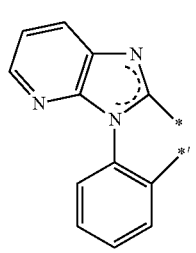

81A-6 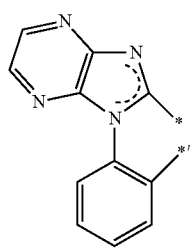

81A-7 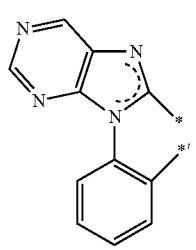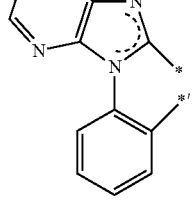

81A-8 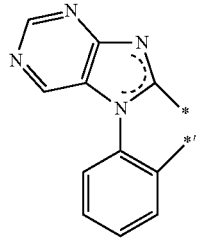

81A-9 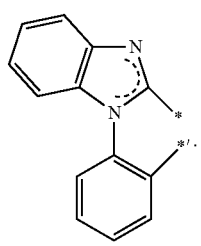

In Formulae 81A-1 to 81A-9, * and *' each indicate a binding site to M in Formula 81.

In one or more embodiments, the organometallic compound represented by Formula 81 may be a homoleptic complex.

In one or more embodiments, in Formula 91, $L_{91}$ may be a benzene group, a pyridine group, a pyrimidine group, or a naphthalene group, each unsubstituted or substituted with at least one $R_{10a}$, a91 to a94 may each independently be 1, 2, 3, or 4, and $R_{10a}$, $R_{91}$, $R_{92}$, $R_{93}$, $R_{94}$, or any combination thereof may each independently be a cyano group.

In one or more embodiments, the dopant included in the emission layer may include at least one of Compounds D1 to D4:

D1 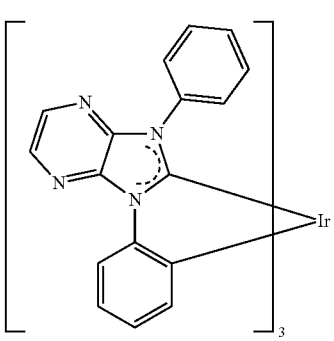

D2 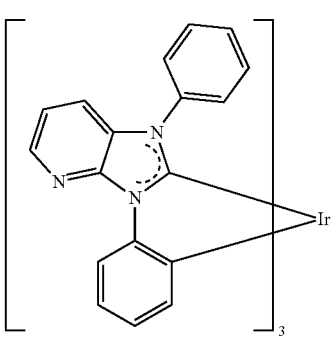

-continued

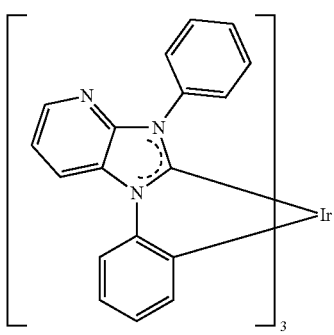

D3

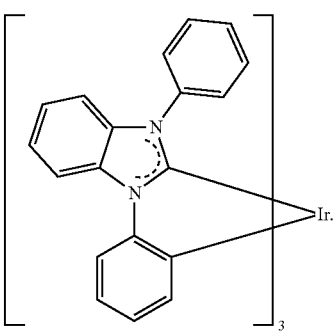

D4

In one or more embodiments, the host included in the emission layer may include at least one of Compounds H1 to H3:

H1

H2

H3

According to one or more embodiments, an organic light-emitting device includes a first electrode, a second electrode facing the first electrode, and an organic layer between the first electrode and the second electrode,
wherein the organic layer includes an emission layer and a hole transport region which is between the first electrode and the emission layer,
the emission layer includes a dopant and a host,
the dopant and the host are different from each other,
an amount of the dopant is equal to or greater than about 20 parts by weight based on 100 parts by weight of the emission layer,
the hole transport region includes a hole injection layer, a hole transport layer, a first electron blocking layer, and a second electron blocking layer, which are sequentially stacked on the first electrode, and
the hole injection layer, the hole transport layer, the first electron blocking layer, and the second electron blocking layer each comprise a compounds and the compounds of the hole injection layer, the hole transport layer, the first electron blocking layer, and the second electron blocking layer are different from each other.

When the amount of the dopant included in the emission layer of the organic light-emitting device is satisfied within the ranges above, the production of the quencher by the polaron in the emission layer may be effectively suppressed. When the organic light-emitting device includes the first electron blocking layer and the second electron blocking layer as described above, the quencher produced in the hole transport region by the excitons or the exciton-to-exciton interactions may be effectively blocked from entering the emission layer. In this regard, the density of the quencher throughout the organic light-emitting device may then be effectively controlled. Furthermore, the transfer of the exciton produced in the emission layer to the hole transport region may be effectively suppressed and thus the photodegradation of the hole transport region by the exciton may be substantially prevented. Thus, the organic light-emitting device may have an improved lifespan.

The emission layer, the dopant, and the host are each the same as described above, and the hole transport region will be described in detail below.

FIG. 1 is a schematic cross-sectional view of an organic light-emitting device 10 according to an exemplary embodiment. Hereinafter, the structure of an organic light-emitting device according to an embodiment of the present disclosure and a method of manufacturing an organic light-emitting device according to an embodiment of the present disclosure will be described in connection with FIG. 1. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide (SnO$_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. For example, the hole transport region may have a hole injection layer/hole transport layer structure, a hole injection layer/hole transport layer/electron blocking layer structure, or a hole injection layer/hole transport layer/first electron blocking layer/second electron blocking layer structure, wherein, for each structure, each layer is sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the hole injection layer is formed by spin coating, the coating conditions may vary according to a material that is used to form the hole injection layer, and the structure and thermal properties of the hole injection layer. For example, the coating conditions may include a coating speed from about 2,000 rpm to about 5,000 rpm, and a temperature at which a heat treatment is performed to remove a solvent after coating may be from about 80° C. to about 200° C.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

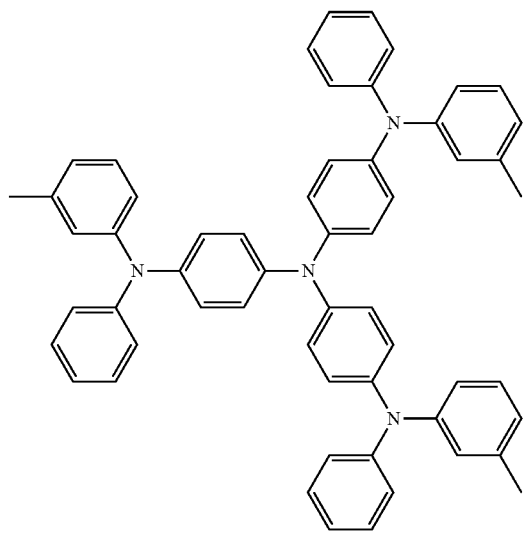

m-MTDATA

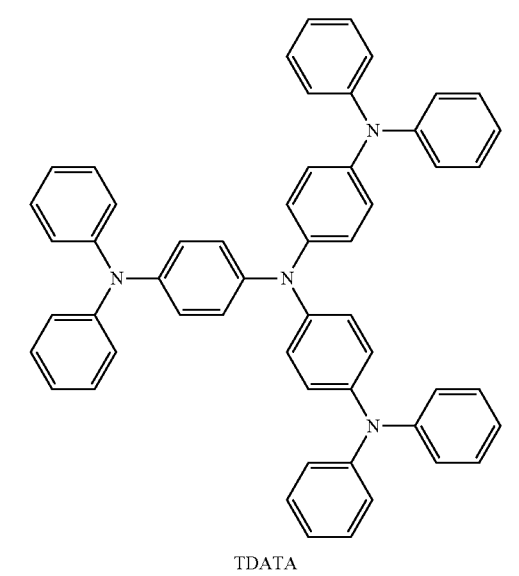

TDATA

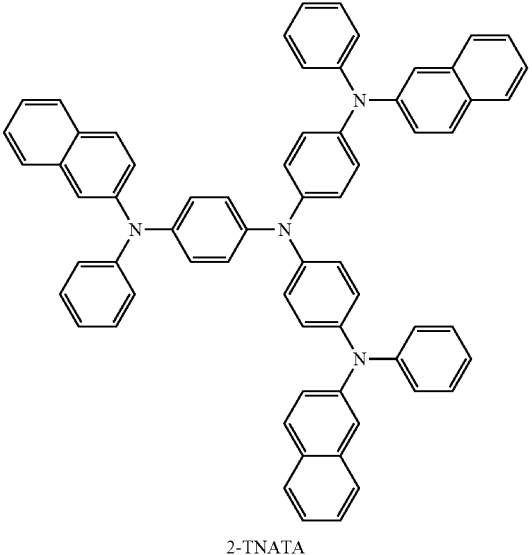

2-TNATA

-continued

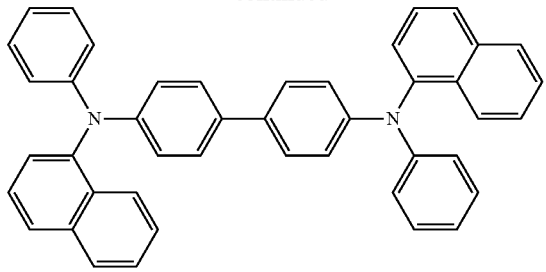

NPB

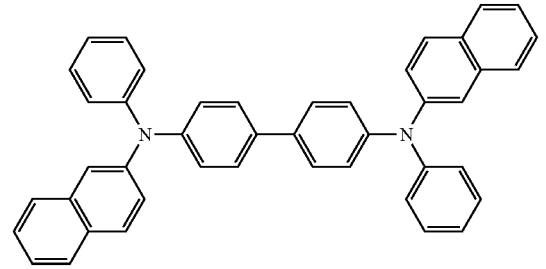

β-NPB

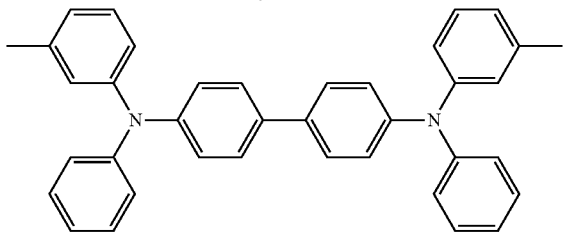

TPD

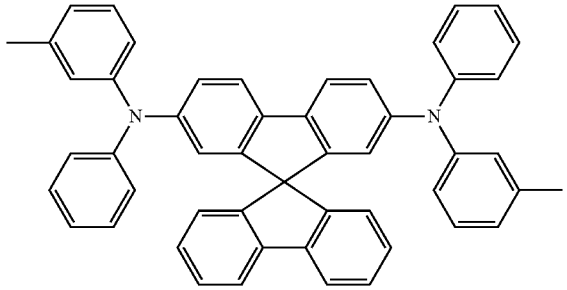

Spiro-TPD

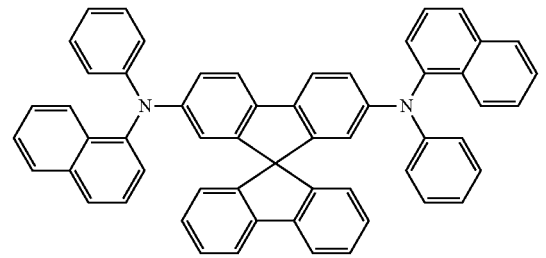

Spiro-NPB

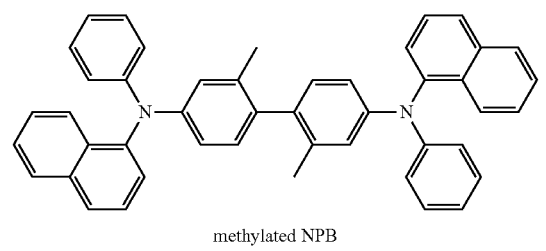

methylated NPB

-continued

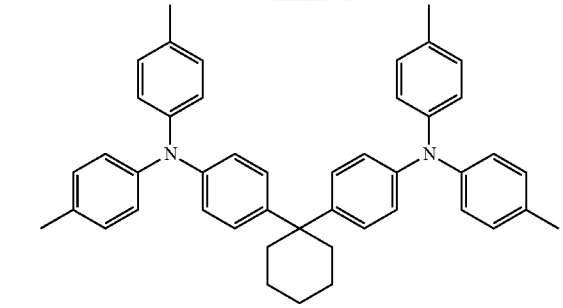

TAPC

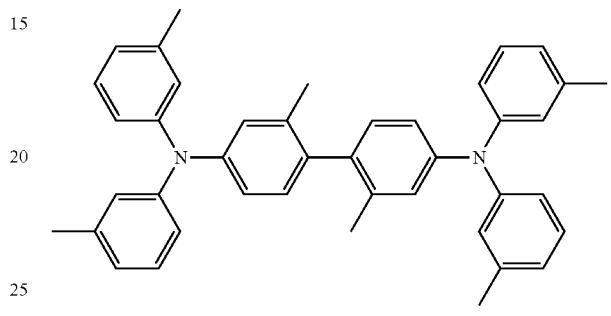

HMTPD

Formula 201

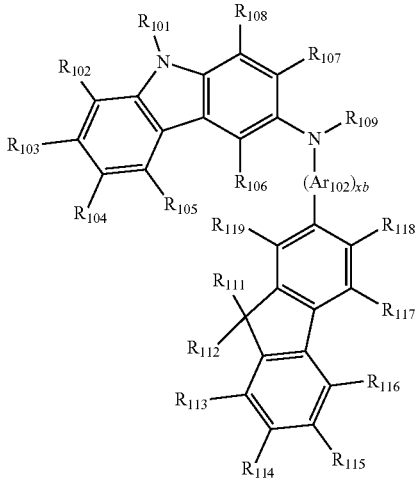

Formula 202

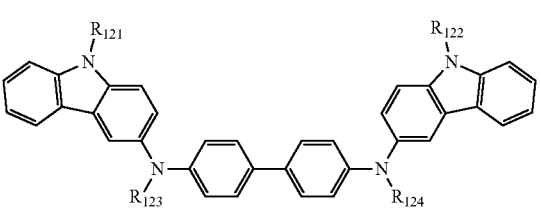

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or may be 0, 1, or 2. For example, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid or a salt thereof, or any combination thereof; or a phenyl group, a naphthyl group, an anthracenyl group, a fluorenyl group or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one embodiment, the compound represented by Formula 201 may be represented by Formula 201A:

Formula 201A

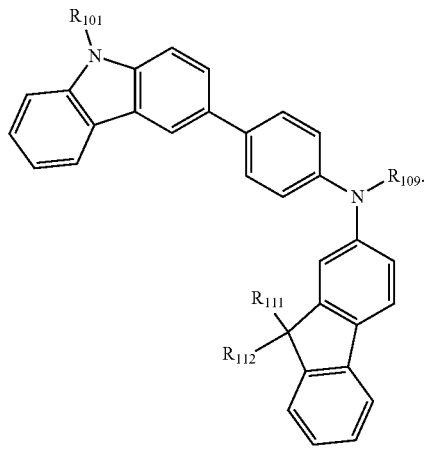

In Formula 201A, $R_{101}$, $R_{111}$, $R_{112}$, and $R_{109}$ may each be the same as described above.

For example, the hole transport region may include one of Compounds HT1 to HT20 or any combination thereof:

HT1

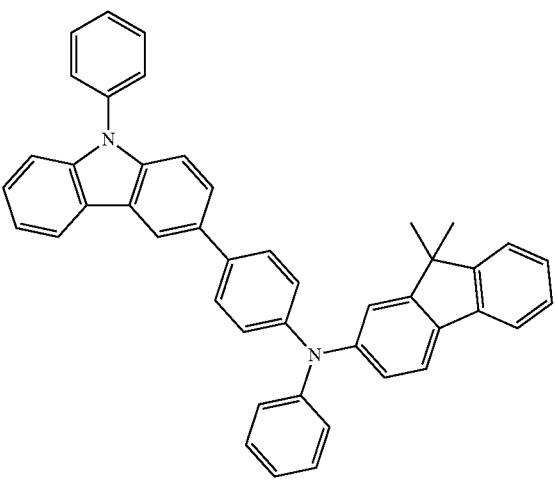

HT2
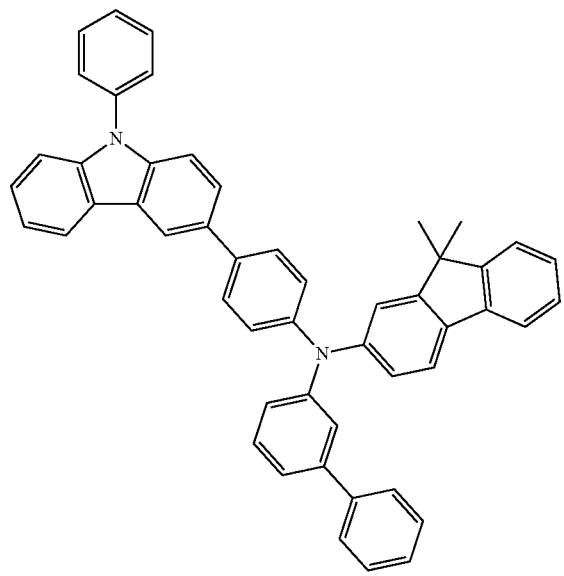
HT4
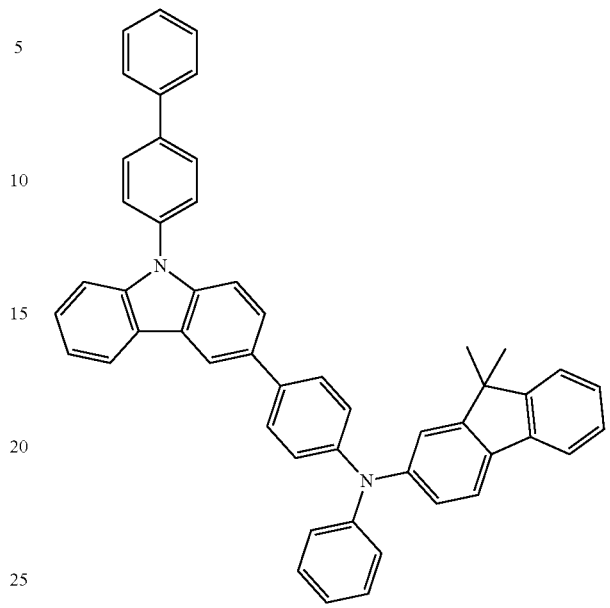
HT3
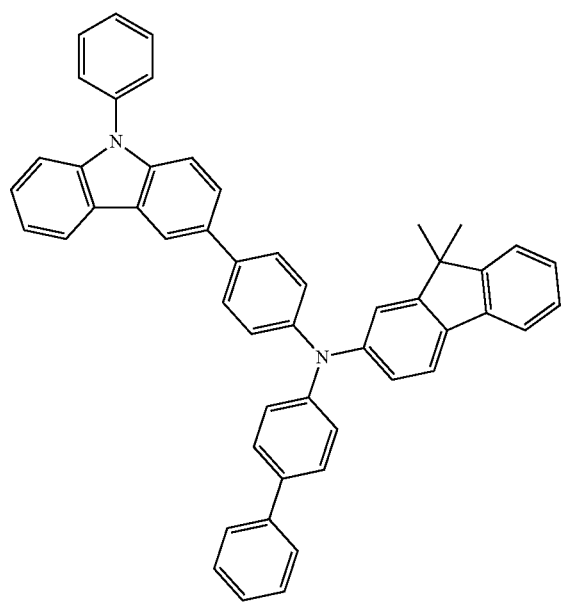
HT5
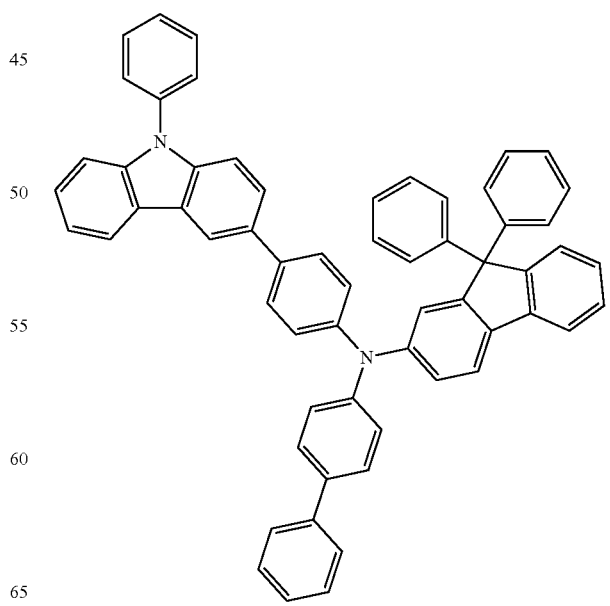

HT6
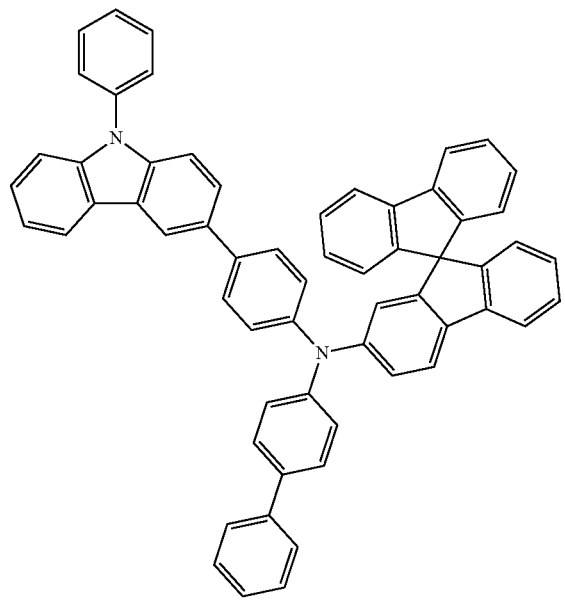
HT8
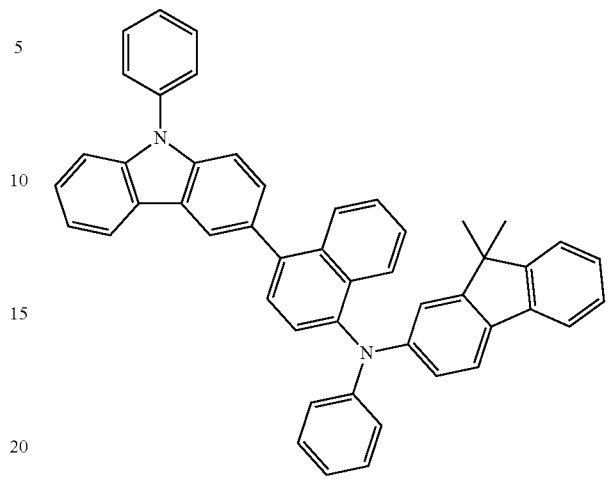
HT9
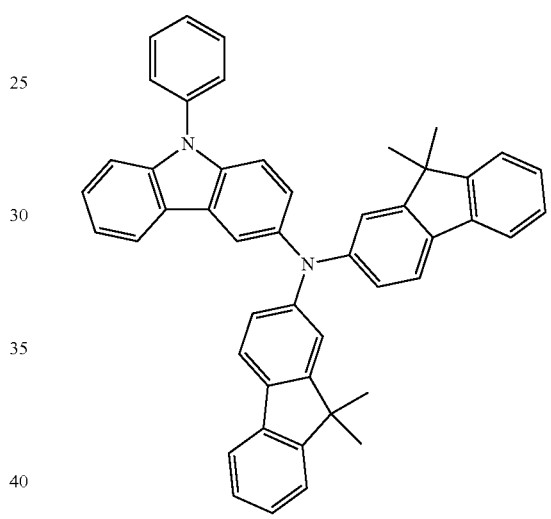
HT7
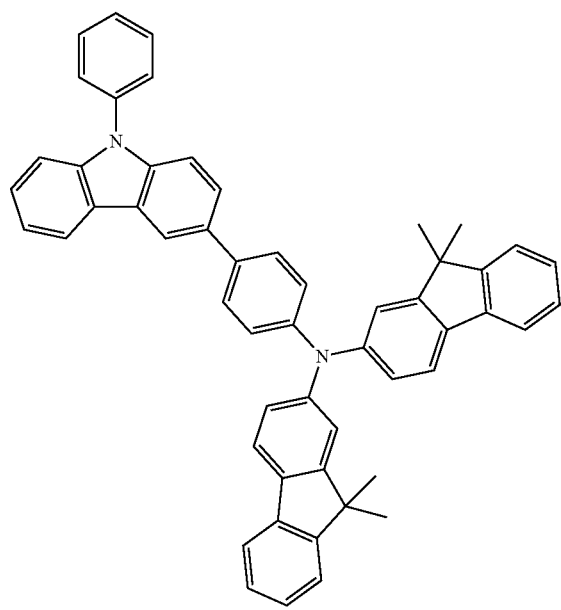
HT10
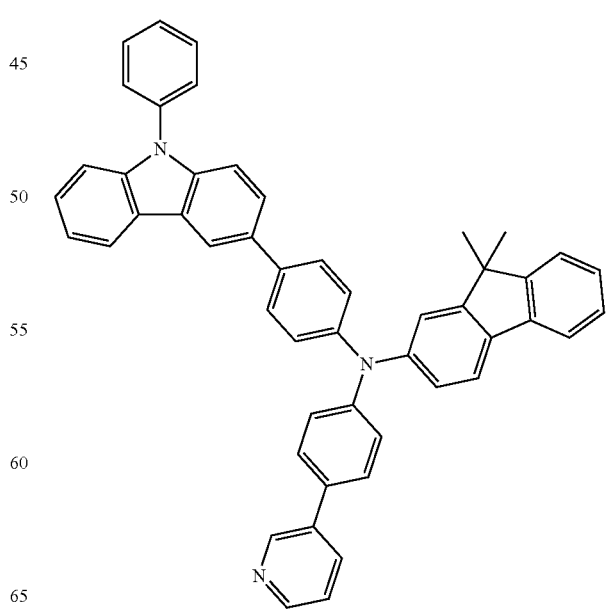

HT11
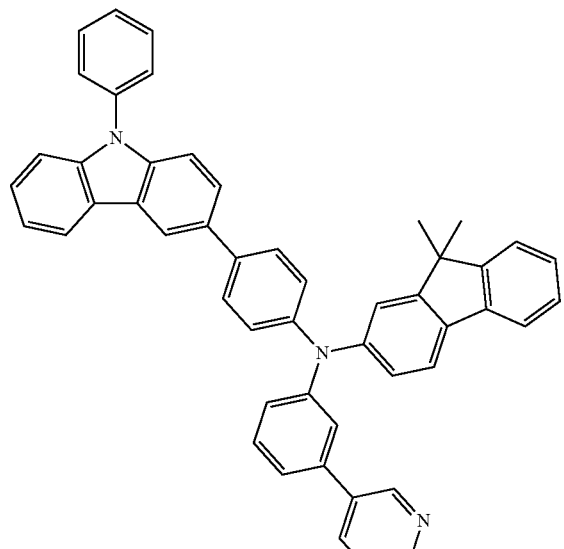
HT12
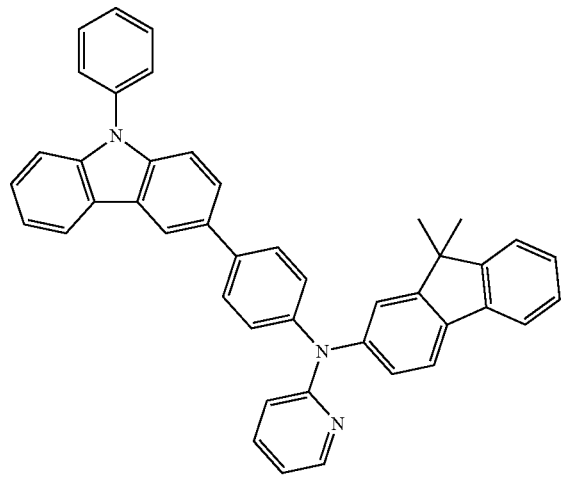
HT13
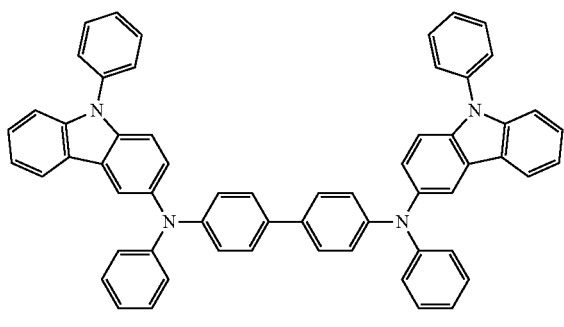
HT14
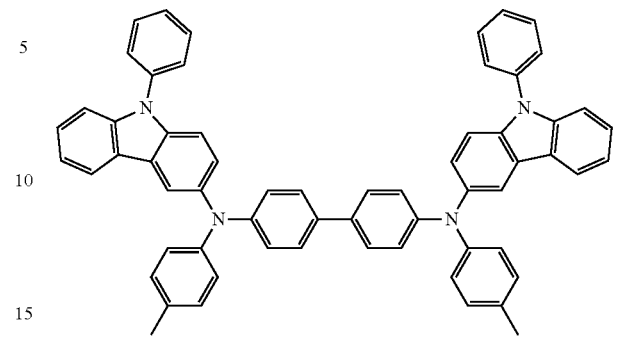
HT15
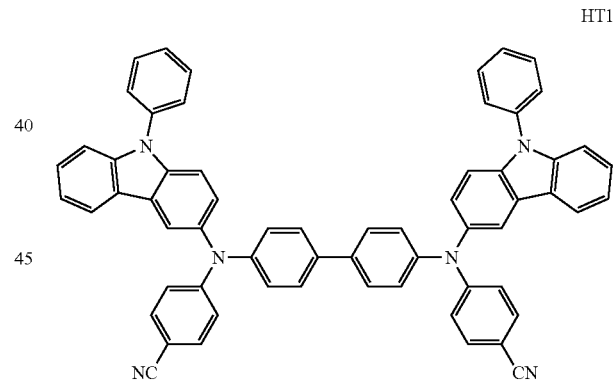
HT16
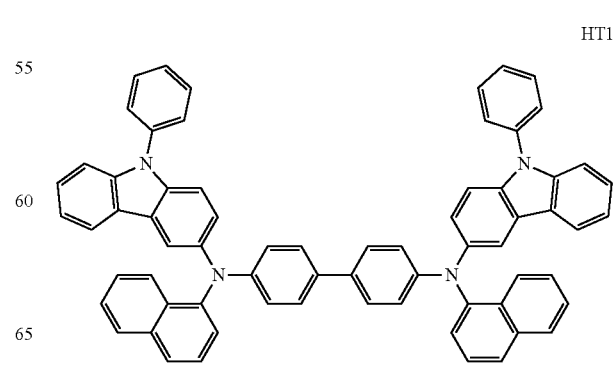
HT17

-continued

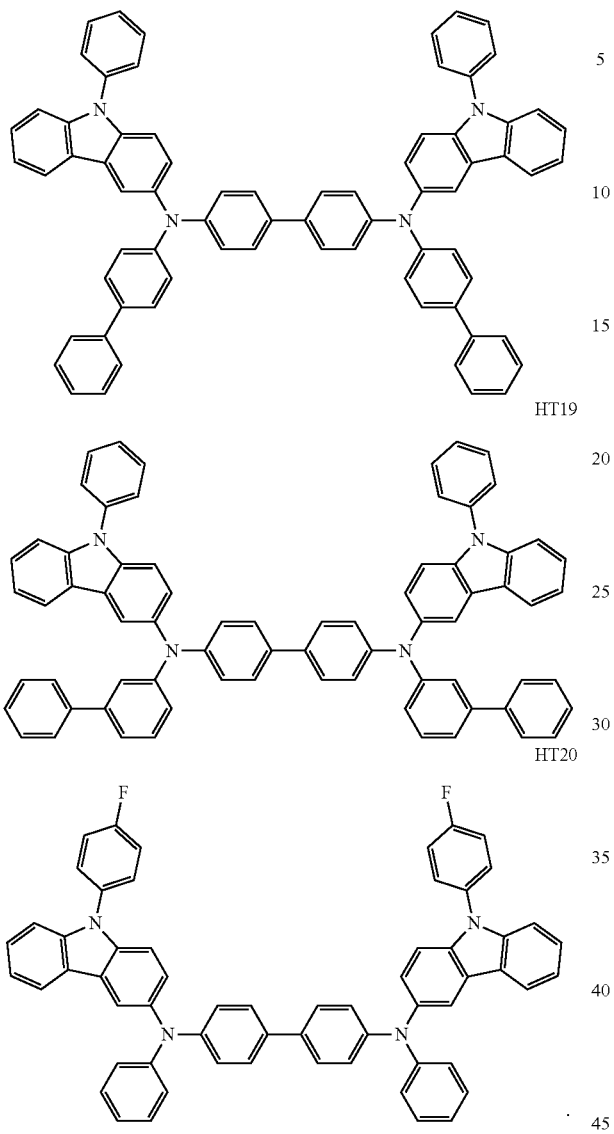

HT18

HT19

HT20

The hole transport region may have a thickness in a range of about 50 Å to about 10,000 Å. The thickness of the hole transport region may be in a range of about 50 Å to about 1,000 Å. When the hole transport region includes a hole injection layer, a hole transport layer, an electron blocking layer, or any combination thereof, the hole injection layer may have a thickness in a range of about 50 Å to about 10,000 Å, for example, about 70 Å to about 1,000 Å (for example, 10 nm), the hole transport layer may have a thickness in a range of about 50 Å to about 2,000 Å, for example, about 100 Å to about 1,500 Å (for example, 5 nm), and the electron blocking layer may have a thickness in a range of about 50 Å to about 2,000 Å, for example, about 100 Å to about 1,500 Å (for example, 10 nm). When the thicknesses of the hole transport region, the hole injection layer, the hole transport layer, and/or the electron blocking layer are within the ranges above, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or any combination thereof. For example, the p-dopant may be: a quinone derivative, such as tetracyanoquinonedimethane (TCNQ), 2,3,5,6-tetrafluoro-tetracyano-1,4-benzoquinonedimethane (F4-TCNQ), or F6-TCNNQ; a metal oxide, such as tungsten oxide and molybdenum oxide; a cyano group-containing compound, such as Compound HT-D1 (or Compound HAT-CN); or any combination thereof:

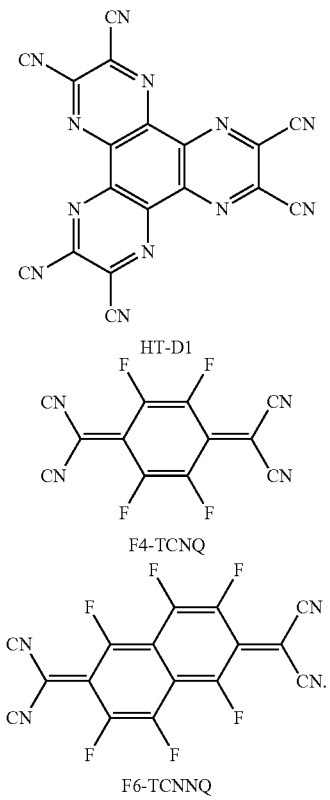

HT-D1

F4-TCNQ

F6-TCNNQ

The hole transport region may further include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for forming the electron blocking layer may include a material that is used in the hole transport region as described above, a host material described herein, or any combination thereof. For example, when the hole transport region includes an electron blocking layer, mCP below, which will be described below, or any combination thereof may be used as the material for forming the electron blocking layer.

In one or more embodiments, the hole transport region may include a hole injection layer, and the hole injection layer consists of the p-dopant.

In one or more embodiments, the hole injection layer may directly contact the first electrode 11.

In one or more embodiments, the hole transport region may include (or consists of) a hole injection layer, a hole transport layer, a first electron blocking layer, and a second electron blocking layer, which are sequentially stacked on the first electrode 11. The hole injection layer consists of the p-dopant, or may directly contact the first electrode 11. Compounds included in the hole injection layer, the hole transport layer, the first electron blocking layer, and the second electron blocking layer may be different from each other. For example, the hole transport layer, the first electron blocking layer, and the second electron blocking layer may each include a carbazole-containing compound, wherein the carbazole-containing compound included in the hole transport layer, the carbazole-containing compound included in the first electron blocking layer, and the carbazole-containing compound included in the second electron blocking layer may be different from each other.

In one or more embodiments, the hole transport layer and the first electron blocking layer may each independently include a carbazole-containing amine compound (for example, a carbazole-containing monoamine compound).

In one or more embodiments, the hole transport layer may include NPB, the first electron blocking layer may include TCTA, and the second electron blocking layer may include mCP.

A thickness ratio of the first electron blocking layer to the second electron blocking layer may be in a range of about 7:3 to about 3:7, about 6:4 to about 4:6, or about 5:5.

By including a plurality of the electron blocking layers including different compounds from each other, the production of the quencher by the polaron in the emission layer may be effectively prevented. Accordingly, the organic light-emitting device including the plurality of the electron blocking layers may have a long lifespan.

The emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer is the same as described above.

A thickness of the emission layer may be in a range of about 100 Å to about 1,000 Å, for example, about 200 Å to about 600 Å. When the thickness of the emission layer is within the ranges above, excellent light-emission characteristics may be obtained without a substantial increase in driving voltage.

Next, an electron transport region may be on the emission layer.

The electron transport region may include a hole blocking layer, an electron transport layer, an electron injection layer, or any combination thereof.

For example, the electron transport region may include a hole blocking layer/electron transport layer/electron injection layer structure or an electron transport layer/electron injection layer structure. The electron transport layer may include a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof.

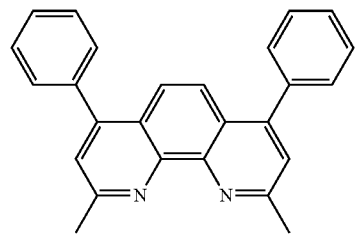

BCP

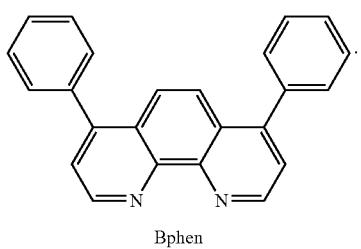

Bphen

A thickness of the hole blocking layer may be in a range of about 20 Å to about 1,000 Å, for example, about 30 Å to about 600 Å. When the thickness of the hole blocking layer is within the ranges above, excellent hole blocking characteristics may be obtained without a substantial increase in driving voltage.

The electron transport layer may include BCP, Bphen, TPBi, Alq$_3$, BAlq, TAZ, NTAZ, or any combination thereof:

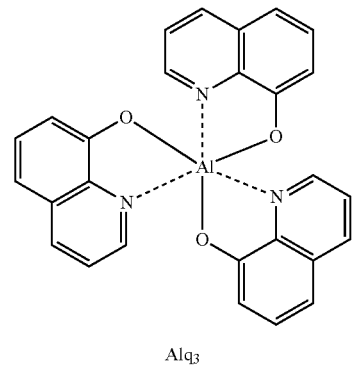

Alq$_3$

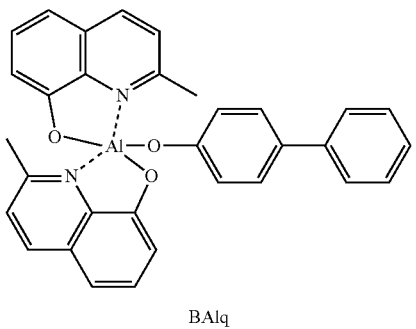

BAlq

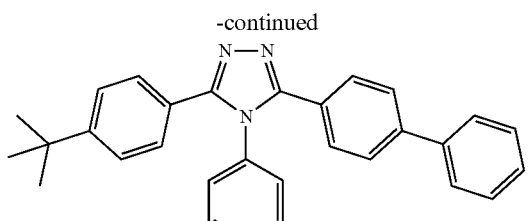
TAZ
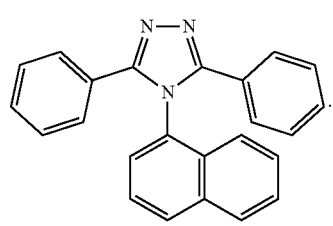
NTAZ
In one or more embodiments, the electron transport layer may include one of Compounds ET1 to ET25 or any combination thereof:
ET1
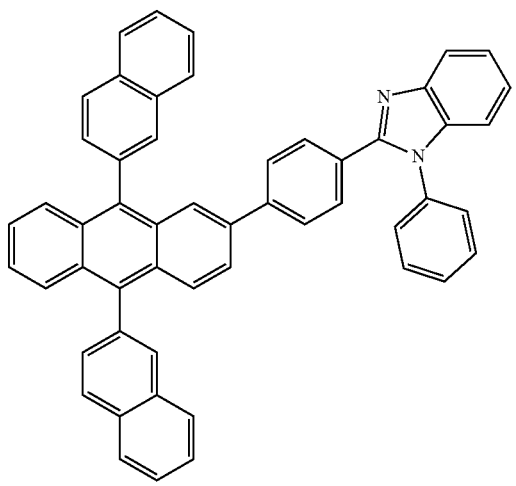
ET2
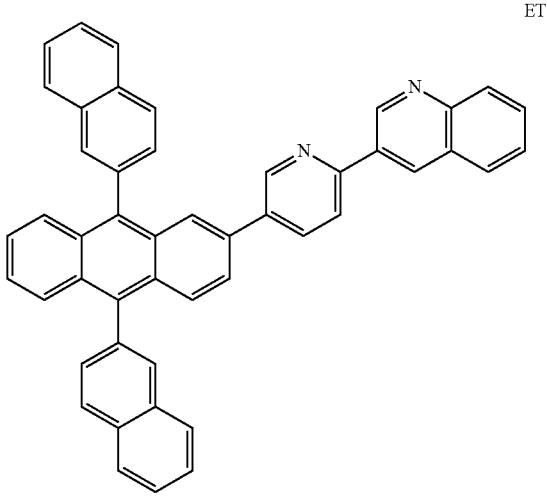
ET3
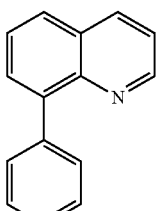
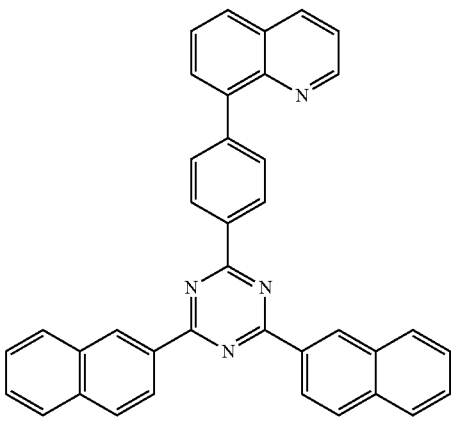
ET4
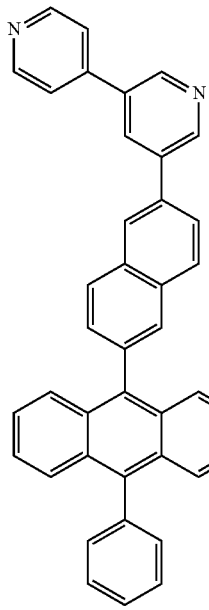
ET5
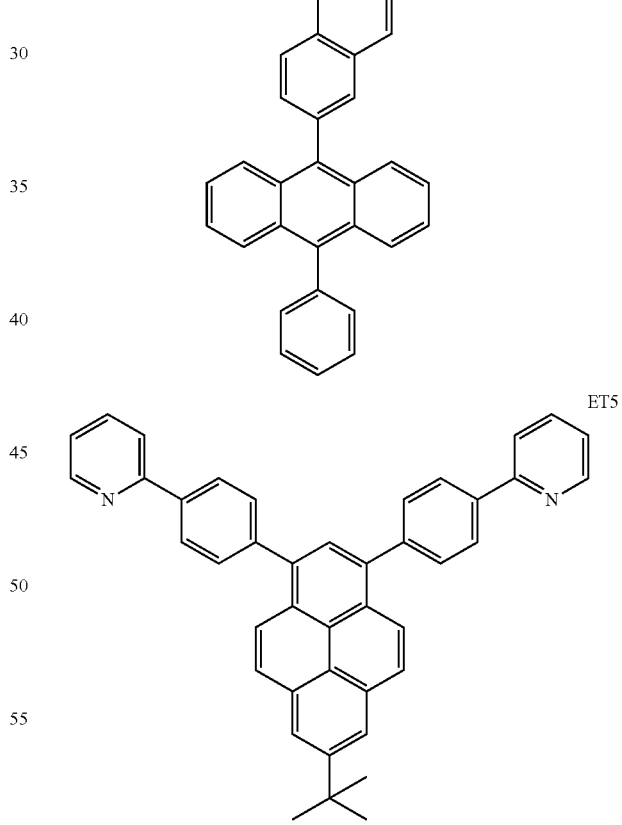

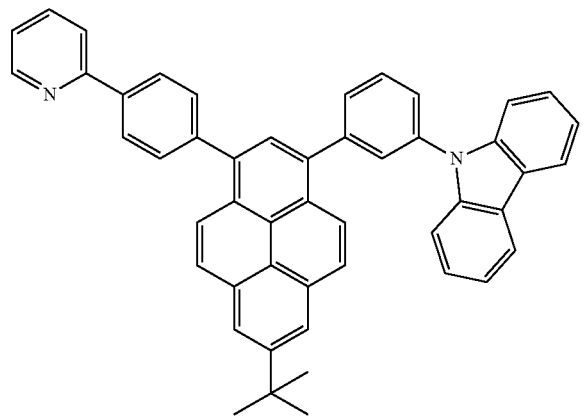
ET6
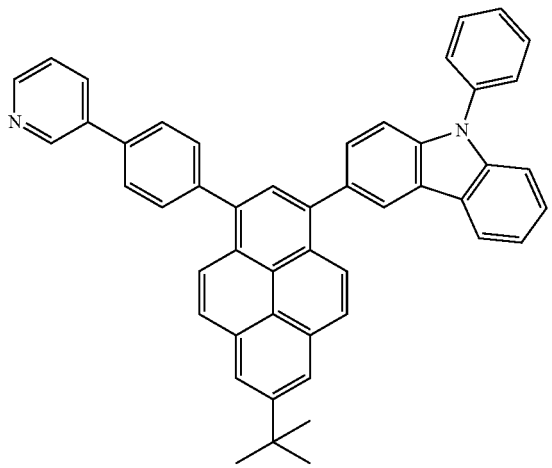
ET9
ET7
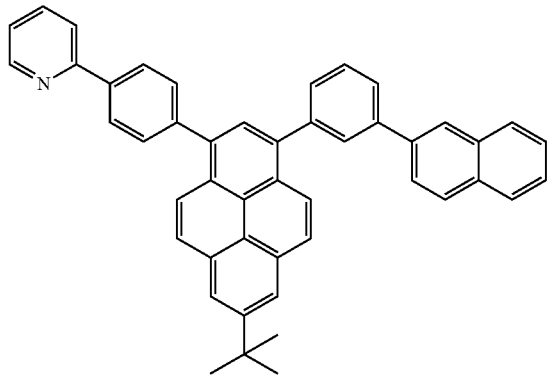
ET10
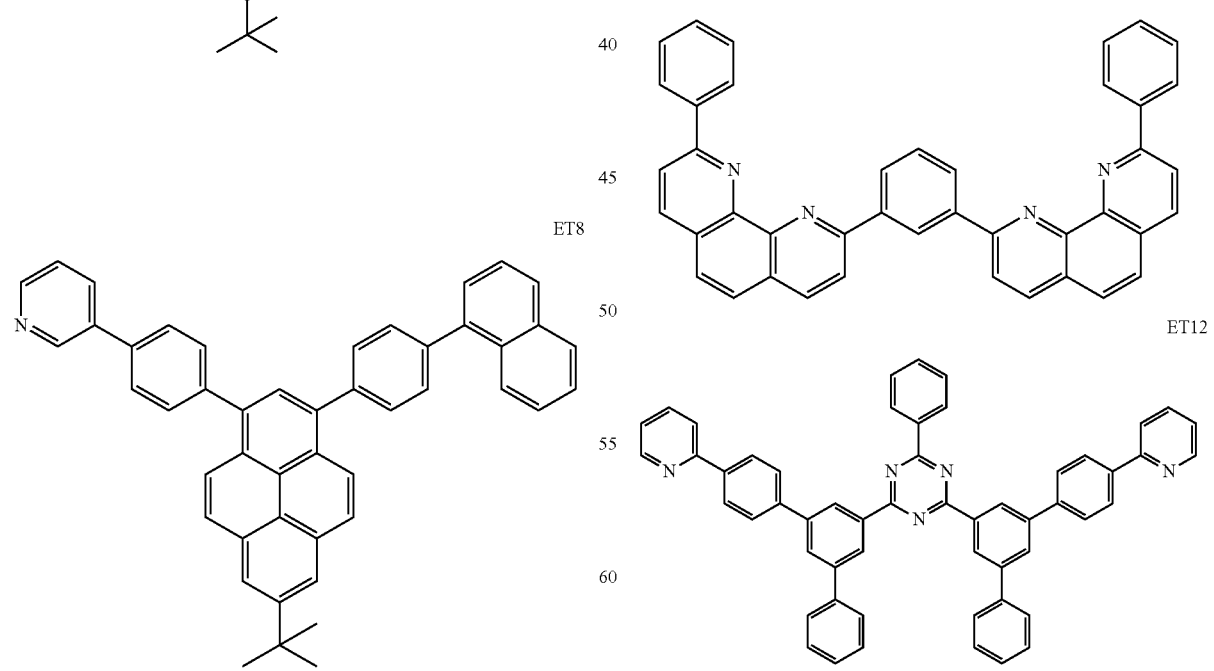
ET8
ET11
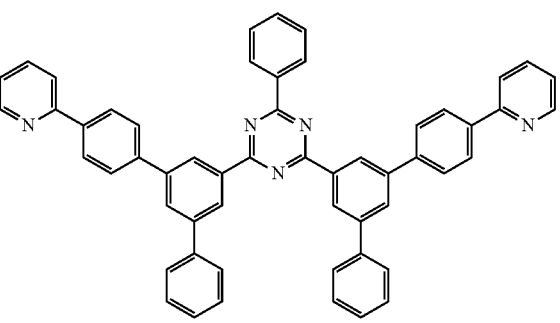
ET12

ET13
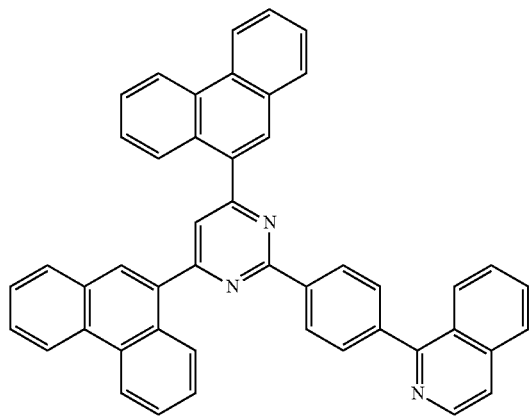
ET16
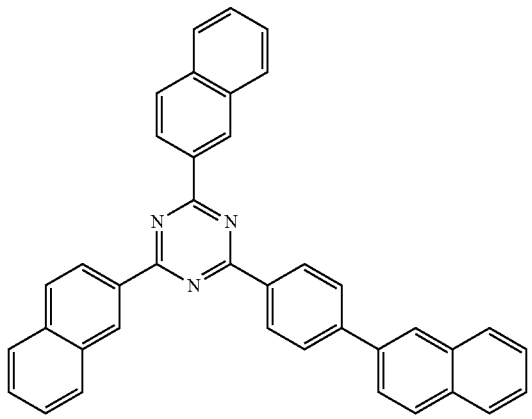
ET14
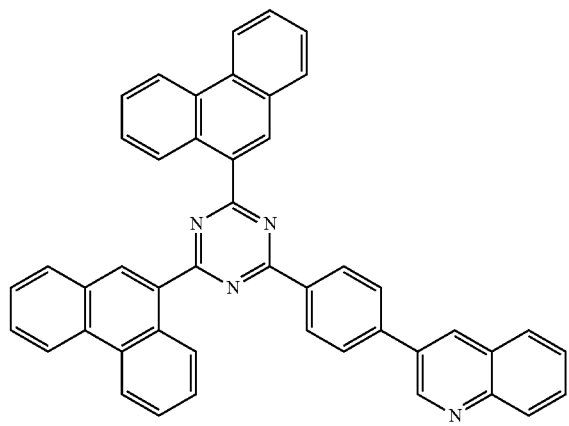
ET17
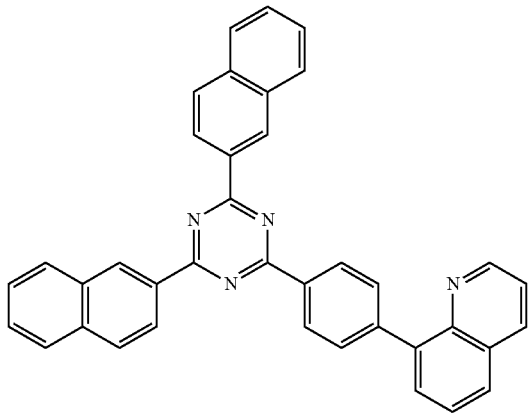
ET15
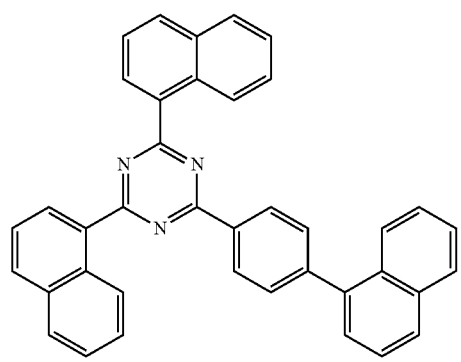
ET18
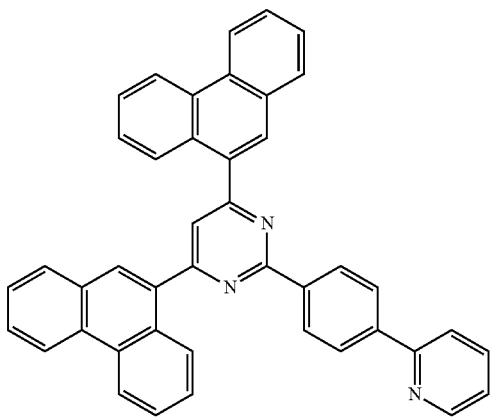

ET19
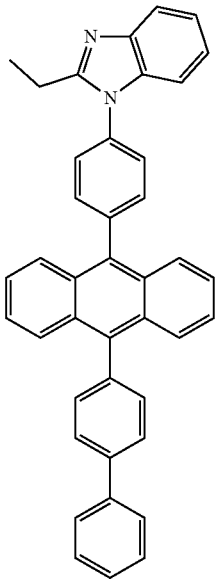
ET20
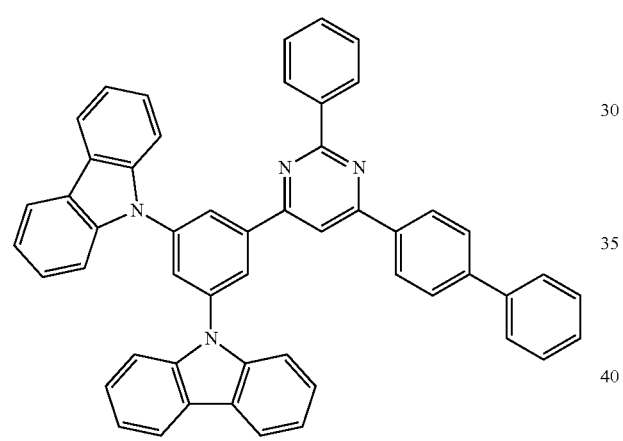
ET21
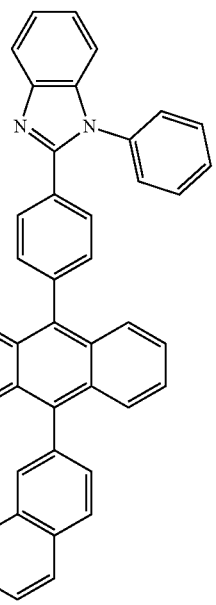
ET22
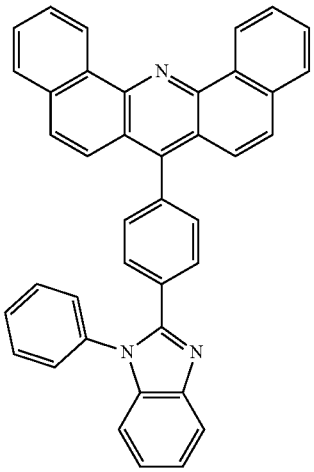
ET23
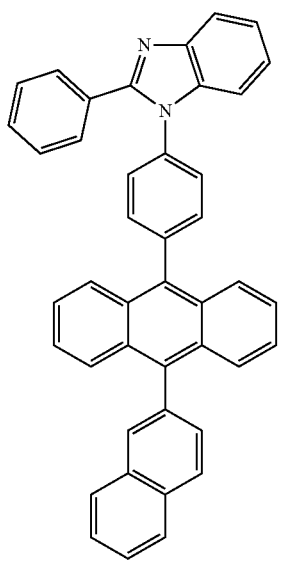
ET24
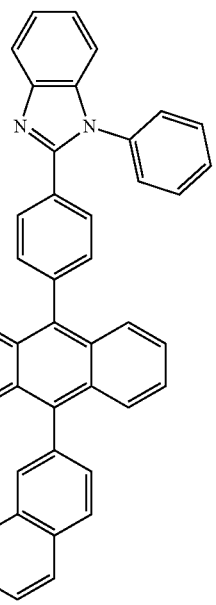

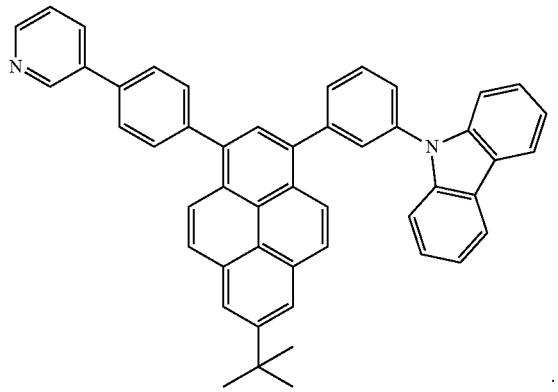

ET25

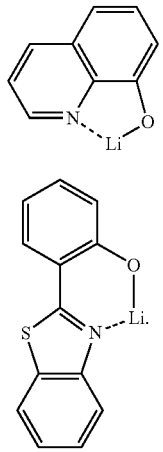

ET-D1

ET-D2

In one or more embodiments, the electron transport region may include a phosphine oxide-containing compound. The phosphine oxide-containing compound may be, for example, DBFPO, DBEPO, Compound ET21, or any combination thereof:

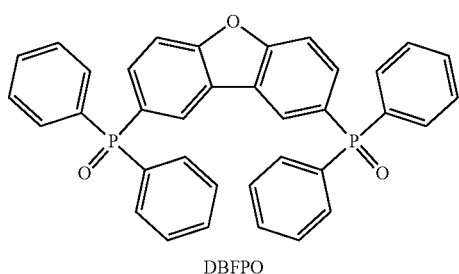

DBFPO

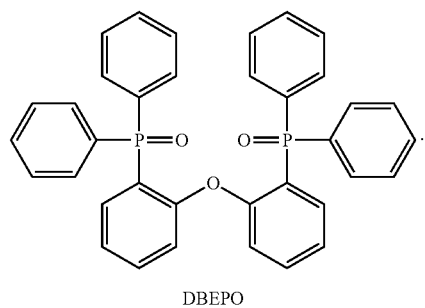

DBEPO

A thickness of the electron blocking layer may be in a range of about 50 Å to about 1,000 Å, for example about 70 Å to about 500 Å. When the thickness of the electron transport layer is within the ranges above, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 (Liq) or Compound ET-D2:

The electron transport region may include an electron injection layer that facilitates the injection of electrons from the second electrode 19 thereinto.

The electron injection layer may include LiF, NaCl, CsF, $Li_2O$, BaO, Liq, or any combination thereof.

A thickness of the electron injection layer may be in a range of about 1 Å to about 100 Å, for example, about 3 Å to about 90 Å. When the thickness of the electron injection layer is within the ranges above, satisfactory electron injection characteristics may be obtained without a substantial increase in driving voltage.

In one or more embodiments, the electron transport region may include a phosphine oxide-containing compound (for example, DBFPO, DBEPO, ET21, or any combination thereof).

In one or more embodiments, the electron transport region may include (or consists of) a hole blocking layer, an electron transport layer, and an electron injection layer which are sequentially stacked on the emission layer. For example, the hole blocking layer may consist of a first material, the electron transport layer may include a first material and a second material, and the electron injection layer may consist of a second material, wherein the first material included in the hole blocking layer and the first material included in the electron transport layer may be identical to each other, and the second material included in the electron transport layer and the second material included in the electron injection layer may be identical to each other. In one or more embodiments, the first material may be a phosphine oxide-containing compound (for example, DBFPO, DBEPO, ET21, or any combination thereof), and the second material may be a Li complex (for example, the compound ET-D1 (or, Liq) or Compound ET-D2).

The second electrode 19 may be located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed by using ITO or IZO may be used as the second electrode 19.

Hereinbefore, the organic light-emitting device has been described with reference to FIG. 1, but embodiments of the present disclosure are not limited thereto.

According to one or more embodiments, the organic light-emitting device may be included in an electronic apparatus. Thus, an electronic apparatus including the organic light-emitting device is provided. The electronic apparatus may include, for example, a display, an illumination, a sensor, and the like.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, and may be a tert-butyl group that is substituted with two methyl groups.

The term "$C_1$-$C_{60}$ alkoxy group" as used herein refers to a monovalent group represented by —$OA_{101}$ (wherein $A_{101}$ is the $C_1$-$C_{60}$ alkyl group), and an example thereof is a methoxy group, an ethoxy group, a propoxy group, a butoxy group, or a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and the term "$C_3$-$C_{10}$ cycloalkylene group" as used herein refers to a divalent group having the same structure as the $C_3$-$C_{10}$ cycloalkyl group.

The term "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl(norbornanyl) group, a bicyclo[2.2.2]octyl group, and the like.

The term "$C_1$-$C_{10}$ heterocycloalkyl group" as used herein refers to a monocyclic group that includes at least one heteroatom selected from N, O, P, Si, S, Se, B and Ge as a ring-forming atom and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, a tetrahydrofuranyl group, a tetrahydro-2H-pyranyl group, a tetrahydrothiophenyl group, and the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, B and Ge as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_7$-$C_{60}$ alkylaryl group" as used herein refers to a $C_6$-$C_{59}$ aryl group that is substituted with at least one $C_1$-$C_{54}$ alkyl group.

The term "$C_1$-$C_{60}$ heteroaryl group" as used herein refers to a monovalent group having at least one hetero atom selected from N, O, P, Si, S, Se, B and Ge as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, B and Ge as a ring-forming atom and a carbocyclic aromatic system having 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other.

The term "$C_2$-$C_{60}$ alkylheteroaryl group" as used herein refers to a $C_1$-$C_{59}$ heteroaryl group that is substituted with at least one $C_1$-$C_{59}$ alkyl group.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_1$-$C_{60}$ alkylthio group" indicates —$SA_{104}$ (wherein $A_{104}$ is the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. An example of the monovalent non-aromatic condensed polycyclic group is fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, S, Se, B and Ge, other than carbon atoms, as a ring-forming atom, and no aromaticity in its entire molecular structure. An example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. The "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, or a fluorene group (, each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, B and Ge other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (, each unsubstituted or substituted with at least one $R_{10a}$).

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene group, and a 5,5-dioxide group," in which, in each group, at least one carbon selected from ring-forming carbons is substituted with nitrogen.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, or a C$_1$-C$_{60}$ alkylthio group;

a C$_1$-C$_{60}$ alkyl group, a C$_2$-C$_{60}$ alkenyl group, a C$_2$-C$_{60}$ alkynyl group, a C$_1$-C$_{60}$ alkoxy group, or a C$_1$-C$_{60}$ alkylthio group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkylaryl group, a C$_6$-C$_{60}$ aryloxy group, a C$_6$-C$_{60}$ arylthio group, a C$_1$-C$_{60}$ heteroaryl group, a C$_2$-C$_{60}$ alkylheteroaryl group, a monovalent non-aromatic condensed polycyclic group, a monovalent non-aromatic condensed heteropolycyclic group, —N(Q$_{11}$)(Q$_{12}$), —Ge(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or any combination thereof;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_1$-C$_{60}$ heteroaryl group, a C$_2$-C$_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_1$-C$_{60}$ alkylthio group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_6$-C$_{60}$ aryloxy group, a C$_6$-C$_{60}$ arylthio group, a C$_1$-C$_{60}$ heteroaryl group, a C$_2$-C$_{60}$ alkyl heteroaryl group, a monovalent non-aromatic condensed polycyclic group, a monovalent non-aromatic condensed heteropolycyclic group, —N(Q$_{21}$)(Q$_{22}$), —Ge(Q$_{23}$)(Q$_{24}$)(Q$_{25}$), —B(Q$_{26}$)(Q$_{27}$), —P(=O)(Q$_{28}$)(Q$_{29}$), —P(Q$_{28}$)(Q$_{29}$), or any combination thereof;

—N(Q$_{31}$)(Q$_{32}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$), or any combination thereof.

In the present specification, Q$_1$ to Q$_9$, Q$_{11}$ to Q$_{19}$, Q$_{21}$ to Q$_{29}$, and Q$_{31}$ to Q$_{39}$ may each independently be: hydrogen; deuterium; —F; —Cl; —Br; —I; a hydroxyl group; a cyano group; a nitro group; an amidino group; a hydrazine group; a hydrazone group; a carboxylic acid or a salt thereof; a sulfonic acid or a salt thereof; a phosphoric acid or a salt thereof; a C$_1$-C$_{60}$ alkyl group which is unsubstituted or substituted with deuterium, a C$_1$-C$_{60}$ alkyl group, a C$_6$-C$_{60}$ aryl group, or any combination thereof; a C$_2$-C$_{60}$ alkenyl group; a C$_2$-C$_{60}$ alkynyl group; a C$_1$-C$_{60}$ alkoxy group; a C$_3$-C$_{10}$ cycloalkyl group; a C$_1$-C$_{10}$ heterocycloalkyl group; a C$_3$-C$_{10}$ cycloalkenyl group; a C$_1$-C$_{10}$ heterocycloalkenyl group; a C$_6$-C$_{60}$ aryl group which is unsubstituted or substituted with deuterium, a C$_1$-C$_{60}$ alkyl group, a C$_6$-C$_{60}$ aryl group, or any combination thereof; a C$_6$-C$_{60}$ aryloxy group; a C$_6$-C$_{60}$ arylthio group; a C$_1$-C$_{60}$ heteroaryl group; a monovalent non-aromatic condensed polycyclic group; or a monovalent non-aromatic condensed heteropolycyclic group.

For example, Q$_1$ to Q$_9$, Q$_{11}$ to Q$_{19}$, Q$_{21}$ to Q$_{29}$ and Q$_{31}$ to Q$_{39}$ described herein may each independently be:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, or —CD$_2$CDH$_2$, or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a C$_1$-C$_{10}$ alkyl group, a phenyl group, or any combination thereof.

Hereinafter, an organic light-emitting device according to embodiments are described in detail with reference to Examples. However, the organic light-emitting device is not limited thereto.

EXAMPLES

Example 1

As an anode, a glass substrate on which ITO was deposited to a thickness of 150 nm was cut to a size of 50 mm×50 mm×0.5 mm, sonicated with isopropyl alcohol and pure water each for 5 minutes, and then, cleaned by exposure to ultraviolet rays and ozone for 30 minutes. The resultant glass substrate was then loaded onto a vacuum deposition apparatus.

HAT-CN was vacuum-deposited on the anode to form a hole injection layer having a thickness of 10 nm, and NPB was deposited on the hole injection layer to form a hole transport layer having a thickness of 50 nm. Subsequently, TCTA was vacuum-deposited on the hole transport layer to form a first electron blocking layer having a thickness of 5 nm, and mCP was vacuum-deposited on the first electron blocking layer to form a second electron blocking layer having a thickness of 5 nm.

Compound H1 (host) and Compound D1 (dopant) were co-deposited at a weight ratio of 80:20 on the electron blocking layer to form an emission layer having a thickness of 30 nm.

Afterwards, DBFPO was vacuum-deposited on the emission layer to form a hole blocking layer having a thickness of 10 nm, and DBFPO and Liq were co-deposited at a weight ratio of 1:1 on the hole blocking layer to form an electron transport layer having a thickness of 30 nm. Subsequently, Liq was vacuum-deposited on the electron transport layer to form an electron injection layer having a thickness of 1 nm, and Al was vacuum-deposited on the electron injection layer to form a cathode having a thickness of 100 nm, thereby manufacturing an organic light-emitting device having a ITO (150 nm)/HAT-CN (10 nm)/NPB (50 nm)/TCTA (5 nm)/mCP (5 nm)/H1:D1 (20 wt %, 30 nm)/DBFPO (10 nm)/DBFPO:Liq (1:1, 30 nm)/Liq (1 nm)/Al (100 nm) structure.

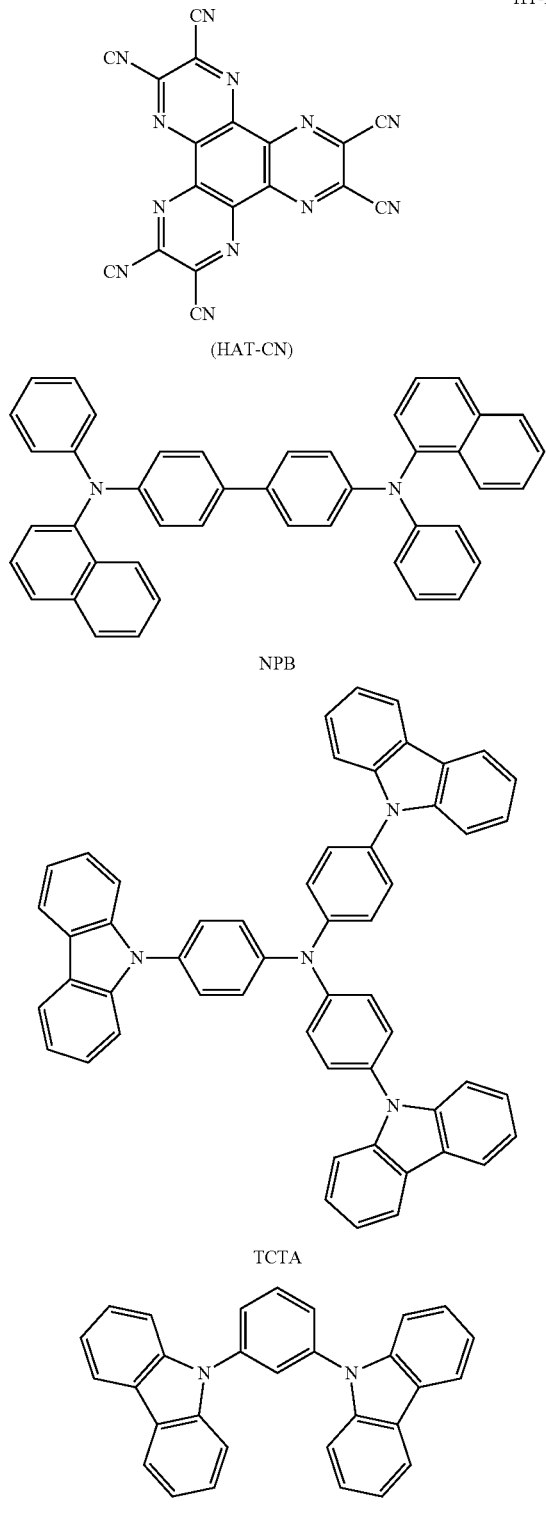

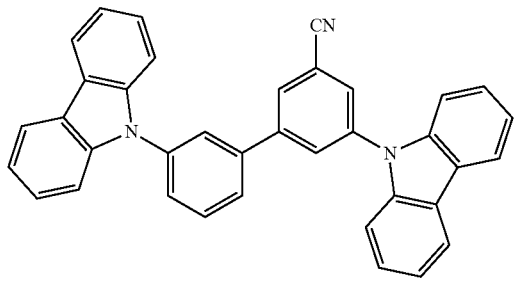

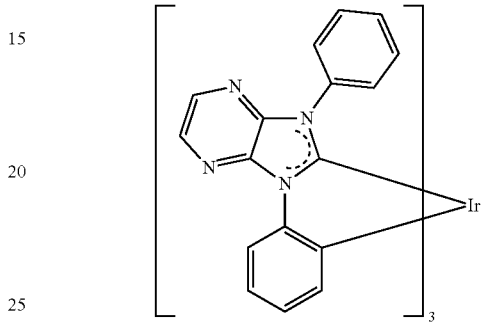

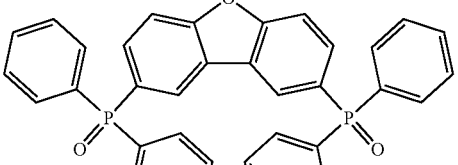

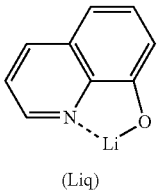

Comparative Example A

An organic light-emitting device was manufactured in the same manner as in Example 1, except that, in forming an emission layer, a weight ratio of the host to the dopant was changed to 90:10.

Comparative Example B

An organic light-emitting device was manufactured in the same manner as in Example 1, except that a first electron blocking layer was not formed, and a thickness of a second electron blocking layer was changed to 10 nm.

Evaluation Example 1

Figure 2:
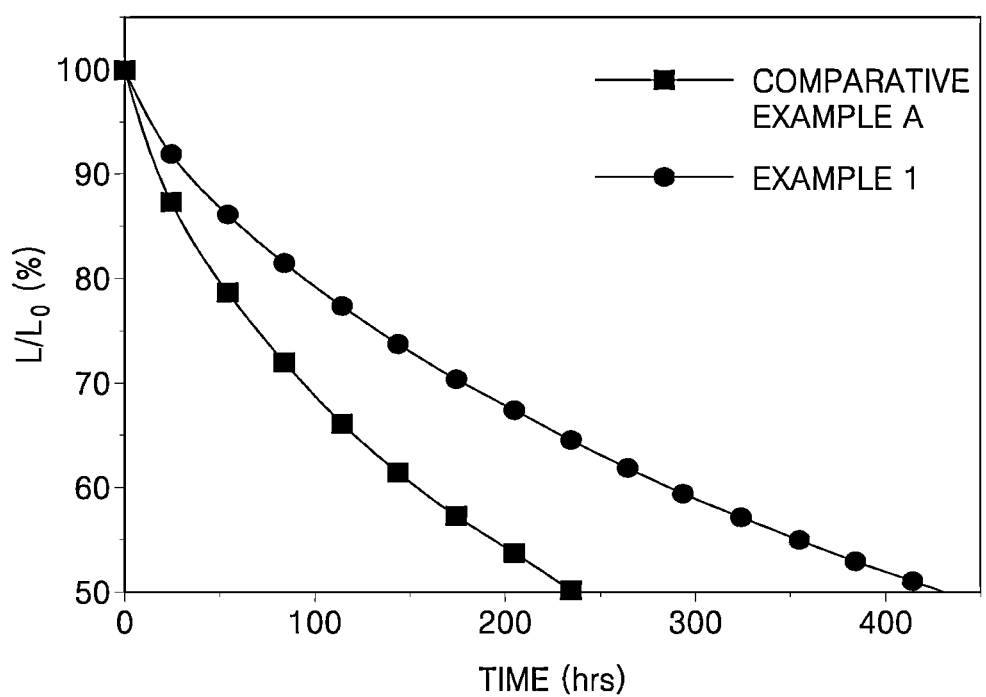
FIG. 2 is a graph of time (hrs) versus luminance ratio (L/L$_0$) (%) of each organic light-emitting device manufactured in Example 1 and Comparative Example A.
Figure 3:
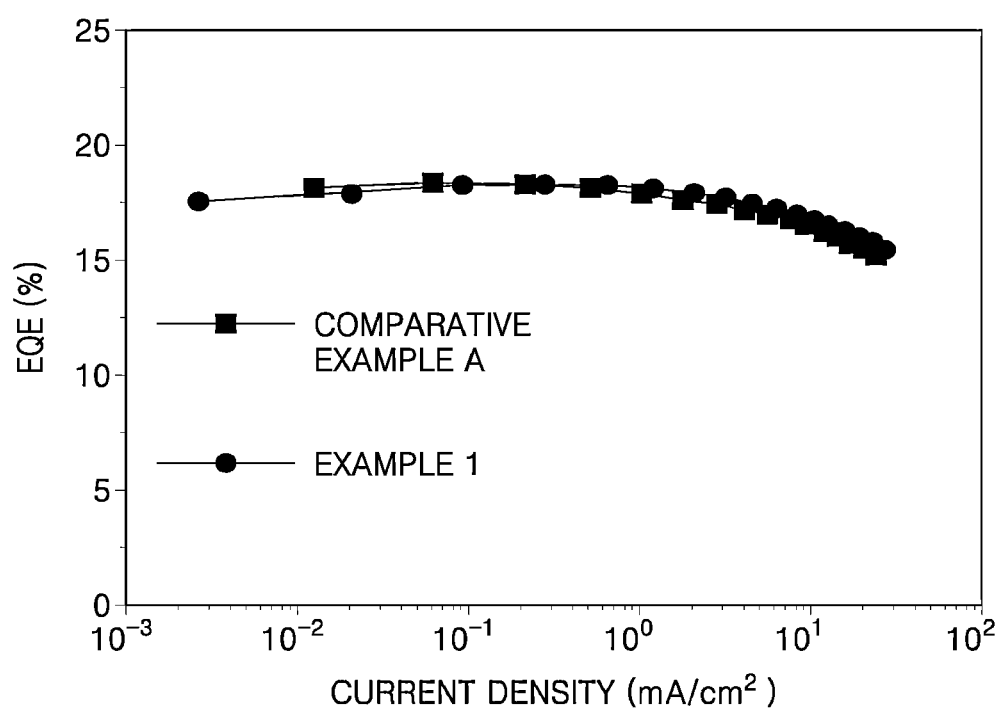
FIG. 3 is a graph of current density (mA/cm$^2$) versus external quantum efficiency (EQE) (%) of each organic light-emitting device manufactured in Example 1 and Comparative Example A.

For each organic light-emitting device manufactured in Example 1 and Comparative Examples A and B, the CIE color coordinate, the maximum value ($EQX_{max}$)(%) of the external quantum efficiency, and the lifespan ($T_{50}$)(hrs) were evaluated, and the results are shown in Table 2. As an evaluation device, a current-voltmeter (Keithley 2400) and luminance meter (Minolta Cs-1000A) were used, and the lifespan ($T_{50}$) (at 500 nit) was evaluated as the time taken for luminance to reduce to 50% of 100% of the initial luminance. Also, a graph of time (hrs) versus luminance ratio (L/L$_0$) (%) and a graph of current density (mA/cm$^2$) versus external quantum efficiency (EQE) (%) of each organic light-emitting device manufactured in Example 1 and Comparative Example A are shown in FIGS. 2 and 3, respectively. In FIG. 2, L/L$_0$ is evaluated by "[a luminance at a certain time (L)/an initial luminance (L$_0$)]×100(%)."

TABLE 1

| | Hole injection layer | Hole transport layer | First electron blocking layer | Second electron blocking layer | Weight ratio of host to dopant |
|---|---|---|---|---|---|
| Example 1 | HAT-CN (10 nm) | NPB (50 nm) | TCTA (5 nm) | mCP (5 nm) | 80:20 |
| Comparative Example A | HAT-CN (10 nm) | NPB (50 nm) | TCTA (5 nm) | mCP (5 nm) | 90:10 |
| Comparative Example B | HAT-CN (10 nm) | NPB (50 nm) | — | mCP (10 nm) | 80:20 |

TABLE 2

| | (CIEx, CIEy) @10 mA/cm$^2$ | EQE$_{max}$ (%) | Lifespan (T$_{50}$) @500 nit (hrs) |
|---|---|---|---|
| Example 1 | (0.16, 0.25) | 18.3% | 430 hrs |
| Comparative Example A | (0.15, 0.23) | 18.3% | 238 hrs |
| Comparative Example B | (0.16, 0.28) | 18.2% | 150 hrs |

Figure 4:
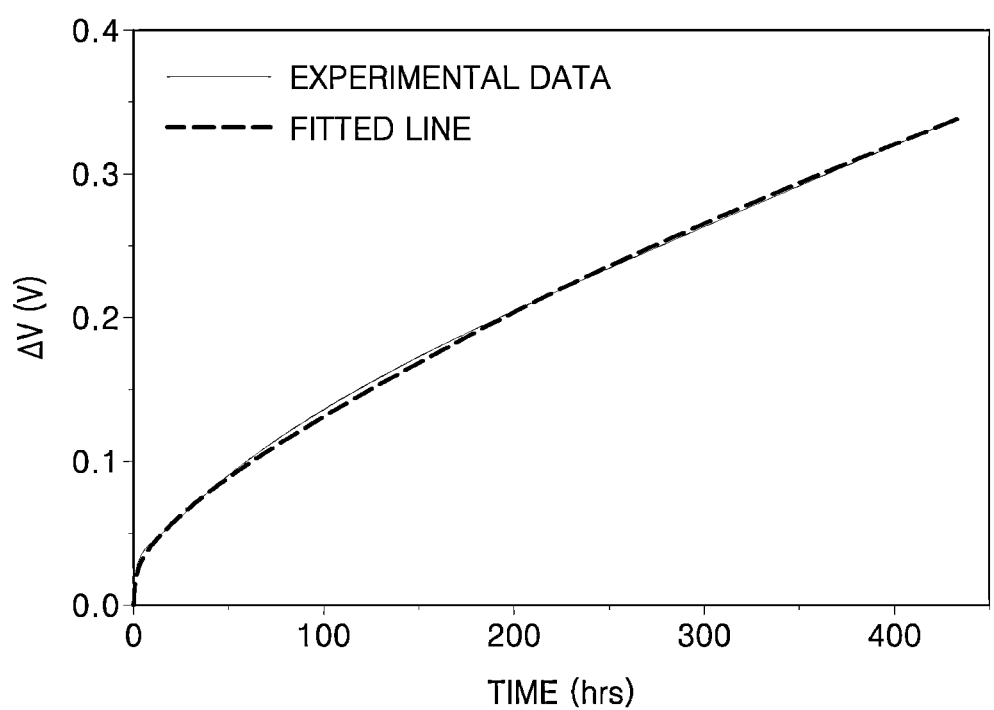
FIG. 4 is shows a curve of time (hrs) versus driving voltage variation ($\Delta V$) (V) of the organic light-emitting device of Example 1.

Referring to Table 2 and FIGS. 2 to 4, it was confirmed that the organic light-emitting device of Example 1 had excellent lifespan characteristics compared to the organic light-emitting devices of Comparative Examples A and B.

Evaluation Example 2

Figure 5:
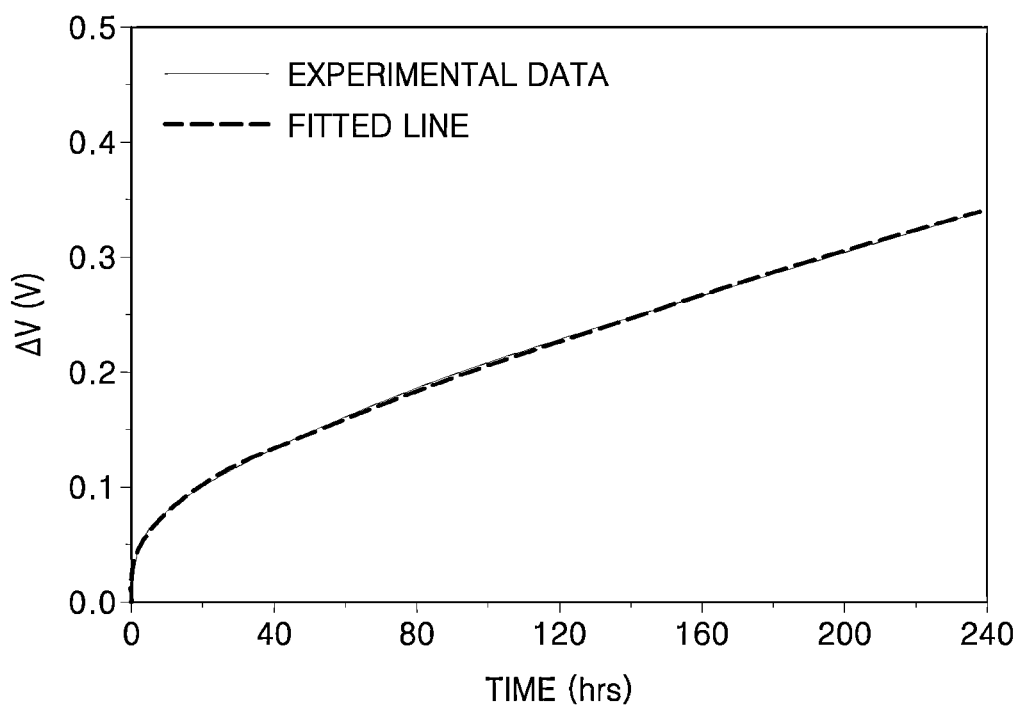
FIG. 5 is shows a curve of time (hrs) versus driving voltage variation ($\Delta V$) (V) of the organic light-emitting device of Comparative Example A.

For each organic light-emitting device manufactured in Example 1, a driving voltage variation was measured by using a current-voltmeter (Keithley 2400) to obtain a curve of the time versus driving voltage variation. After fitting a rate equation of quencher production from the curve of the time versus driving voltage variation, [Q(t=T$_{50}$)]$_{Polaron}$ of the organic light-emitting device of Example 1 were calculated from the 0th term for density of excitons in the rate equation of the quencher production and [Q(t=T$_{50}$)]$_{Environmental}$ of the organic light-emitting device of Example 1 were calculated by performing an additional fitting to a rapid increase of the driving voltage at an initial driving voltage variation. The results are shown in Table 3. The time taken for luminance to reduce to 50% of the initial luminance, i.e., lifespan (T$_{50}$), after driving the organic light-emitting device of Example 1 at 500 nit was shown in Table 2. The same process was repeated for the organic light-emitting device of Comparative Example A, and the results are shown in Table 3. The curve of the time (hrs) versus driving voltage variation (ΔV) (V) of each of the organic light-emitting devices of Example 1 and Comparative Example A are shown in FIGS. 4 and 5, respectively.

TABLE 3

| | [Q(t = T$_{50}$)]$_{Polaron}$ (cm$^{-3}$) | [Q(t = T$_{50}$)]$_{Environmental}$ (cm$^{-3}$) |
|---|---|---|
| Example 1 | 1.88 × 10$^{17}$ | 1.30 × 10$^{17}$ |
| Comparative Example A | 3.36 × 10$^{17}$ | 2.13 × 10$^{17}$ |

Referring to Table 3, it was confirmed that [Q(t=T$_{50}$)]$_{Polaron}$ and [Q(t=T$_{50}$)]$_{Environmental}$ in the organic light-emitting device of Example 1 having the improved lifespan compared to the organic light-emitting devices of Comparative Example A were smaller than [Q(t=T$_{50}$)]$_{Polaron}$ and [Q(t=T$_{50}$)]$_{Environmental}$ of the organic light-emitting devices of Comparative Example A.

According to the one or more embodiments, an organic light-emitting device having a long lifespan by controlling quencher density and an electronic apparatus including such an organic light-emitting device may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:
a first electrode, a second electrode facing the first electrode, and an organic layer between the first electrode and the second electrode,
wherein the organic layer comprises an emission layer,
wherein the emission layer comprises a dopant and a host, the dopant and the host are different from each other, and an amount of the dopant is equal to or greater than about 20 parts by weight based on 100 parts by weight of the emission layer,
wherein the dopant is a phosphorescent dopant comprising a transition metal and at least one bidentate ligand, and at least one bidentate ligand among the at least one bidentate ligand comprises a carbene moiety bound to the transition metal via a coordinate bond, and
[Q(t=T$_{50}$)]$_{Polaron}$ of the organic light-emitting device is greater than 0 cm$^{-3}$ and equal to or less than about 3.30×10$^{17}$ cm$^{-3}$,
[Q(t=T$_{50}$)]$_{Polaron}$ is a density of a quencher produced by a polaron in the organic light-emitting device during driving the organic light-emitting device at 500 nit at a time at which a luminance becomes 50% of an initial luminance, and
Q(t=T$_{50}$)]$_{Polaron}$ is calculated i) by obtaining a curve of time versus driving voltage variation by measuring driving voltage variation of the organic light-emitting device over the time (t) at which a luminance becomes 50% of the initial luminance, ii) by fitting a rate equation of quencher production from the curve of the time versus driving voltage variation, and iii) from a 0th term for a density of excitons in the rate equation of the quencher production.

2. The organic light-emitting device of claim 1, wherein [Q(t=T$_{50}$)]$_{Polaron}$ is greater than 0 cm$^{-3}$ and equal to or less than about 1.95×10$^{17}$ cm$^{-3}$.

3. The organic light-emitting device of claim 1, wherein $[Q(t=T_{50})]_{Polaron}$ is greater than 0 cm$^{-3}$ and equal to or less than about $1.88 \times 10^{17}$ cm$^{-3}$.

4. The organic light-emitting device of claim 1, wherein
$[Q(t=T_{50})]_{Environmental}$ of the organic light-emitting device is greater than 0 cm$^{-3}$ and less than about $2.10 \times 10^{17}$ cm$^{-3}$, $[Q(t=T_{50})]_{Environmental}$ is a density of a quencher produced by an external environmental factor in the organic light-emitting device during driving the organic light-emitting device at 500 nit at a time at which a luminance becomes 50% of an initial luminance, and $Q(t=T_{50})]_{Environmental}$ is calculated i) by obtaining a curve of time versus driving voltage variation by measuring driving voltage variation of the organic light-emitting device over the time (t) at which the luminance becomes 50% of the initial luminance, ii) by fitting a rate equation of quencher production from the curve of the time versus driving voltage variation, and iii) by performing an additional fitting to a rapid increase of the driving voltage at an initial driving voltage variation.

5. The organic light-emitting device of claim 4, wherein the external environmental factor is oxygen, moisture, or any combination thereof.

6. The organic light-emitting device of claim 5, wherein an amount of the external environmental factor is greater than 0 ppm and equal to or less than about 1,000 ppm.

7. The organic light-emitting device of claim 4, wherein $[Q(t=T_{50})]_{Environmental}$ is greater than 0 cm$^{-3}$ and equal to or less than about $1.30 \times 10^{17}$ cm$^{-3}$.

8. The organic light-emitting device of claim 1, wherein the phosphorescent dopant emits blue light.

9. The organic light-emitting device of claim 1, wherein the phosphorescent dopant emits blue light having a CIEx coordinate from about 0.13 to about 0.17 and a CIEy coordinate from about 0.20 to about 0.30.

10. The organic light-emitting device of claim 1, wherein the host comprises at least one cyano group and at least one carbazole group.

11. The organic light-emitting device of claim 1, wherein the organic layer further comprises a hole transport region between the first electrode and the emission layer, the hole transport region comprises a hole injection layer, and the hole injection layer consists of a p-dopant.

12. The organic light-emitting device of claim 1, wherein the organic layer further comprises a hole transport region between the first electrode and the emission layer,
the hole transport region comprises a hole injection layer, a hole transport layer, a first electron blocking layer, and a second electron blocking layer, which are sequentially stacked on the first electrode, and
the hole injection layer, the hole transport layer, the first electron blocking layer, and the second electron blocking layer each comprise a compound and the compounds of the hole injection layer, the hole transport layer, the first electron blocking layer, and the second electron blocking layer are different from each other.

13. The organic light-emitting device of claim 12, wherein compounds of the hole transport layer, the first electron blocking layer, and the second electron blocking layer each comprise a carbazole-containing compound, and the and the carbazole-containing compounds of the hole transport layer, the first electron blocking layer, and the second electron blocking layer are different from each other.

14. The organic light-emitting device of claim 1, wherein the organic layer further comprises an electron transport region between the emission layer and the second electrode, and the electron transport region comprises a phosphine oxide-containing compound.

15. The organic light-emitting device of claim 1, wherein
the organic layer further comprises an electron transport region between the emission layer and the second electrode,
the electron transport region comprises a hole blocking layer, an electron transport layer, and an electron injection layer, which are sequentially stacked on the emission layer,
the hole blocking layer consists of a first material,
the electron transport layer comprises the first material and a second material,
the electron injection layer consists of the second material,
the first material included in the hole blocking layer and the first material included in the electron transport layer are identical to each other, and
the second material included in the electron transport layer and the second material included in the electron injection layer are identical to each other.

16. An electronic apparatus comprising the organic light-emitting device of claim 1.

* * * * *